(12) United States Patent
Lu et al.

(10) Patent No.: US 9,166,172 B2
(45) Date of Patent: Oct. 20, 2015

(54) MULTIWALL CARBON NANOTUBE OPTO-ELECTRONIC DEVICES

(75) Inventors: Rongtao Lu, Lawrence, KS (US); Judy Zhihong Wu, Lawrence, KS (US)

(73) Assignee: THE UNIVERSITY OF KANSAS, Lawrence, KS (US)

( * ) Notice: Subject to any disclaimer, the term of this patent is extended or adjusted under 35 U.S.C. 154(b) by 99 days.

(21) Appl. No.: 13/878,912

(22) PCT Filed: Oct. 11, 2011

(86) PCT No.: PCT/US2011/055807
§ 371 (c)(1),
(2), (4) Date: Jun. 11, 2013

(87) PCT Pub. No.: WO2012/051202
PCT Pub. Date: Apr. 19, 2012

(65) Prior Publication Data
US 2013/0264542 A1    Oct. 10, 2013

Related U.S. Application Data

(60) Provisional application No. 61/392,031, filed on Oct. 11, 2010.

(51) Int. Cl.
*H01L 29/06* (2006.01)
*H01L 51/00* (2006.01)
*G01J 5/02* (2006.01)
*G01J 5/08* (2006.01)
(Continued)

(52) U.S. Cl.
CPC .............. *H01L 51/0048* (2013.01); *G01J 5/023* (2013.01); *G01J 5/0853* (2013.01); *B82Y 15/00* (2013.01); *B82Y 20/00* (2013.01)

(58) Field of Classification Search
None
See application file for complete search history.

(56) References Cited

U.S. PATENT DOCUMENTS 6,919,730 B2    7/2005    Cole
7,268,350 B1    9/2007    Ouvrier-Buffet
(Continued)

OTHER PUBLICATIONS

International Search Report and Written Opinion of Feb. 21, 2012; International Application No. PCT/US11/55807.
(Continued)

*Primary Examiner* — Robert Bachner
(74) *Attorney, Agent, or Firm* — Shook, Hardy & Bacon LLP

(57) ABSTRACT

A high-sensitivity detector for opto-electronic detection using multiwall carbon nanotubes (MWCNTs) is provided. More specifically, multiwall carbon nanotube films demonstrate an infrared bolometric photoresponse higher than SWCNT films at room temperature. The observed D* exceeding $3.3 \times 10^6$ cm $Hz^{1/2}$/W with MWCNT-film bolometers and can be further improved to over $1 \times 10^7$ cm $Hz^{1/2}$/W by adding graphene flakes. The response time of about 1-2 milliseconds with MWCNT bolometers is more than an order of magnitude shorter than that of SWCNT bolometers. For individual MWCNTs with specially designed asymmetric Schottky contacts, one on the sidewall and the other covering the end, the photocurrent has been efficiently harvested and provides a higher detectivity of $6.2 \times 10^9$ cm·$Hz^{1/2}$/W at room temperature, which is one order of magnitude higher than the convectional $VO_x$ detector and makes MWCNT competitive for practical optoelectronic detections over infrared and even longer wavelength range.

19 Claims, 22 Drawing Sheets

(51) Int. Cl.
*B82Y 15/00* (2011.01)
*B82Y 20/00* (2011.01)

(56) References Cited

U.S. PATENT DOCUMENTS

| | | | |
|---|---|---|---|
| 7,959,969 B2 | 6/2011 | Sansom | |
| 2002/0192441 A1* | 12/2002 | Kalkan et al. | 428/209 |
| 2006/0261433 A1* | 11/2006 | Manohara et al. | 257/471 |
| 2008/0149970 A1* | 6/2008 | Thomas et al. | 257/288 |
| 2010/0028247 A1* | 2/2010 | Strano et al. | 423/447.2 |
| 2010/0038540 A1* | 2/2010 | Hannebauer | 250/338.1 |
| 2010/0206362 A1* | 8/2010 | Flood | 136/252 |

OTHER PUBLICATIONS

Hydrogen Sensing Properties of Multi-Walled Carbon Nanotubes; Kun Guo, Ahalapitiya H. Jayatissa; Materials Science and Engineering; (2008) pp. 1556-1559; www.elsevier.com/locate/msec.

Single-Electron Transistor Made of Two Crossing Multiwalled Carbon Nanotubes and Its Noise Properties; M. Ahlskog, R. Tarkiainen, R. Roschier, P. Hakonen; Applied Physics Letters; vol. 77, No. 24;Dec. 11, 2000; pp. 4037-4039.

* cited by examiner

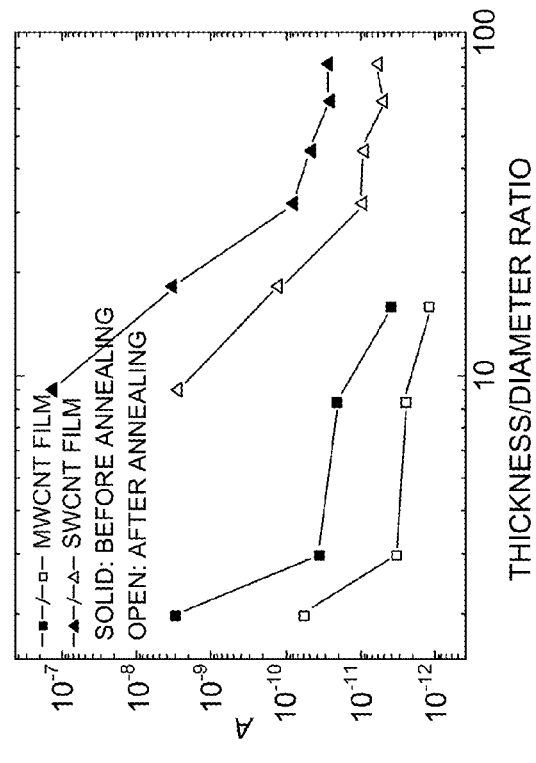
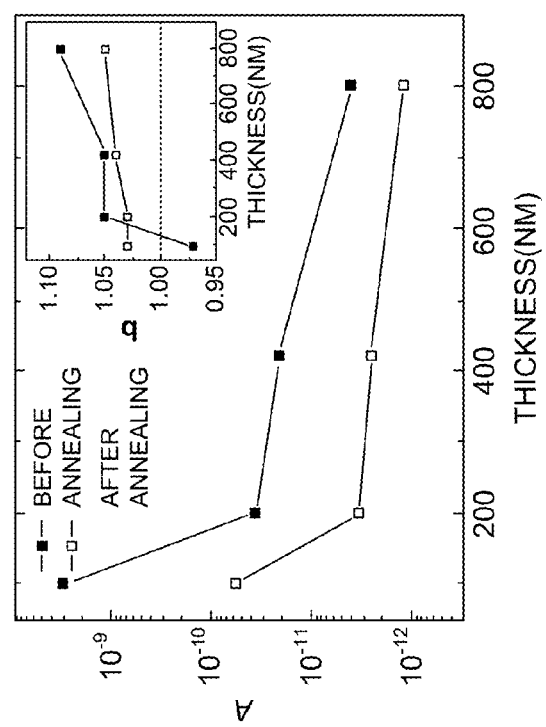
FIG. 11B.
FIG. 11A.

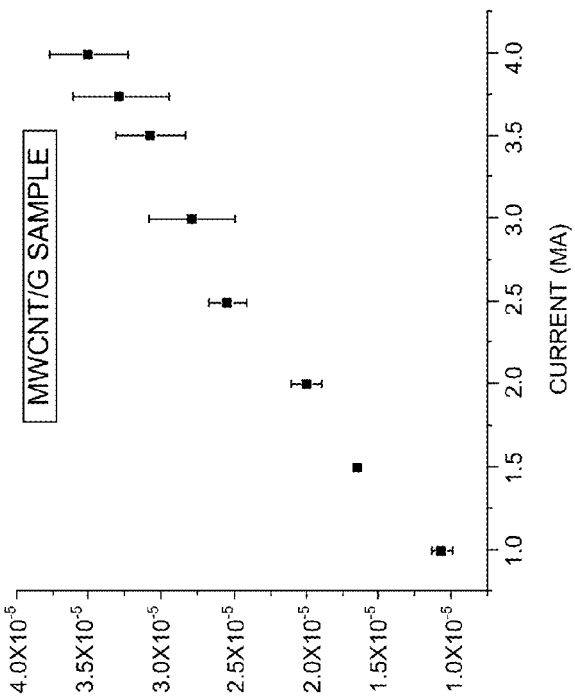
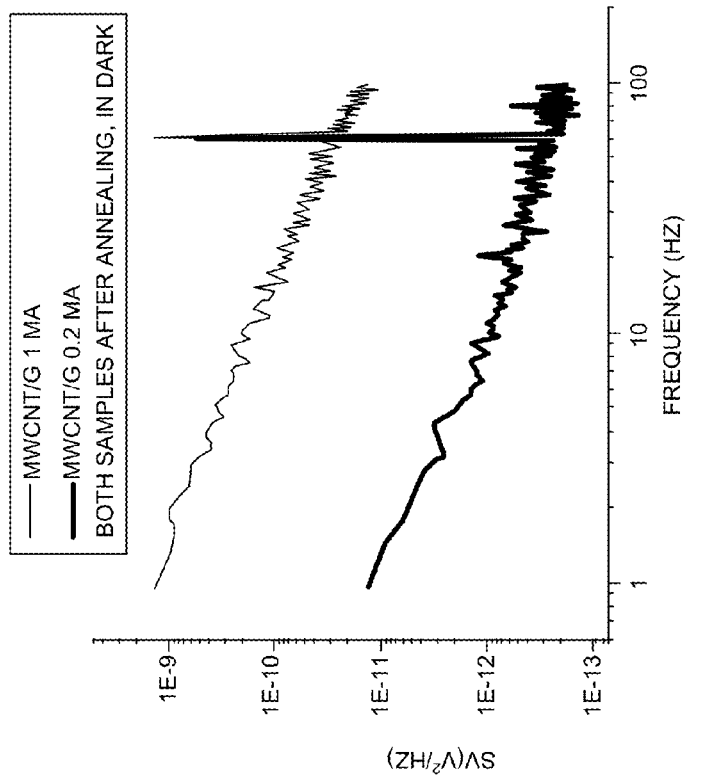
FIG. 21B.
FIG. 21A.

MULTIWALL CARBON NANOTUBE OPTO-ELECTRONIC DEVICES

CROSS-REFERENCE TO RELATED APPLICATIONS

This application claims priority to PCT Application No. PCT/US11/55807 entitled "Multiwall Carbon Nanotube Opto-Electronic Devices," filed Oct. 11, 2011, which claims priority to U.S. Provisional Application No. 61/392,031 entitled "Multiwall Carbon Nanotube Bolometers," filed Oct. 11, 2010, the disclosure of both of which is hereby incorporated by reference in its entirety.

STATEMENT REGARDING FEDERALLY SPONSORED RESEARCH OR DEVELOPMENT

This invention was made with Government support under Grant No. W911NF-09-1-2095, awarded by the US Army Research Office (ARO). The Government has certain rights in this invention.

TECHNICAL FIELD

The present invention relates to the use of multi-wall carbon nanotube (MWCNT) films and individual MWCNT in photo-electronic device applications. More particularly, embodiments of the invention relate to the use of MWCNT film bolometers and individual MWCNT devices for high-sensitivity opto-electronic detection.

BACKGROUND OF THE INVENTION

Carbon nanotubes (CNTs) may be used in a variety of devices, and have demonstrated outstanding absorption of light in a wide wavelength range, making them promising candidates for opto-electronic detector applications. Such photoresponse under infrared (IR) radiation may be a dominantly exciton (binded electron-hole pair) generation and dissociation either into the phonons (or lattice vibration manifested as sample temperature rise), or into free photo-generated charge carriers (photo-carriers). The exciton mechanism is in contrast to the direct photoconductivity possibly due to transition associated to the series of van Hove singularity in one-dimensional electronic density states.

With single wall CNTs (SWCNT), a one-dimensional system, the binding energy of the exciton is high (on the order of a few hundreds of milli-electron-volt), leading to difficulties in dissociation of the photo-excited excitons to photo-carriers without a provided strong electric field. Additionally, bolometric response may not be observable if the SWCNT's thermal link to the environment is sufficiently high. This is particularly true for SWCNTs, which have a high thermal conductance of up to 8000 W/mK at room temperature. Reducing the SWCNT film's thermal link to the environment is thus necessary in order to obtain an adequate bolometric photoresponse.

One way to reduce the thermal link is to suspend SWCNT films, which may enhance the bolometric photoresponse. Nevertheless, the best-obtained uncooled figure-of-merit detectivity (D*) around $4.5 \times 10^5$ cmHz$^{1/2}$/W is nearly three orders of magnitude lower than that of conventional VOx bolometers. In addition, the response time of the SWCNT-film bolometers, in the range of 40-60 ms occurs in circumstances when SWCNTs are suspended, and must be further reduced by at least an order of magnitude for practical IR imaging systems. Further improvement of SWCNT-bolometer performance faces several fundamental limitations associated with the SWCNT films including reduced light absorption at small thicknesses approaching the CNT percolation thresholds, difficulties in suspending very thin CNT films, a large number of inter-tube junctions that may limit electrical and thermal transport, and a large surface area that amplifies effects of molecules such as oxygen absorbed/attached to the SWCNT surface. SWCNT have only one CNT shell so the surface effect, which is affected by almost any species absorbed/attached of the CNT surface, dominates the device properties. Consequently, the applications of SWCNTs on opto-electronic detections may be limited.

Individual CNTs may also be used to build Schottky devices, which typically consist a Schottky contact paired with another Ohmic contact on the other side, by collecting the photocurrent induced by the incident photons. The photocurrent is primarily generated from the excitons separated by the build-in electrical potential at the metal-CNT Schottky interface. However, the best current responsivity is below a few tens of A/W for CNT Schottky detectors and photocurrent may not be efficiently collected. The performances of previously reported CNT Schottky devices are far below practical requirements

BRIEF SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Additionally, although this application discusses specific examples of various embodiments of multiwall carbon nanotube opto-electronic detectors, these are merely examples of embodiments and are not meant to be limiting.

Embodiments of the present invention relate to the use of MWCNT films in bolometers for high-sensitivity detection. Further, embodiments of the invention relate to MWCNT films in bolometers for high-sensitivity detection, without additional suspension. In embodiments, a MWCNT can be viewed as a set of coaxial graphene cylinders with fixed inter-shell spacing of approximately 0.34 nm. Such spacing may lead to an enhanced light absorption (per tube) that is proportional to the number of inner shells. In addition, all inner CNT shells are naturally suspended in MWCNTs, which facilitates generating an optimal bolometeric photoresponse through 1) enhanced photo absorption through all inner CNT shells, 2) restricted thermal link to the environment only through the outermost CNT shell, and 3) minimized surface effect, in that most inner CNT shells are no longer exposed.

In MWCNTs, the neighboring shells are incommensurate, which prohibits charge delocalization in the radial direction and results in highly anisotropic charge and thermal conduction between the axial (higher conduction) and radial (lower conduction) directions. Transport studies of MWCNTs with electrodes directly on the sidewall of the MWCNTs have demonstrated that the outmost shell (or few shells) of the MWCNT, which could be either semiconducting or metallic, plays the dominant role in electrical and thermal transport (considering electrodes are typically laid on the outmost shell). This means that the phonons generated on the inner shells of a MWCNT via photon absorption and exciton dissociation can only be dissipated after reaching the outmost shell. The semiconductor band gap of MWCNTs decreases approximately inversely with the tube diameter, which facilitates using MWCNTs for opto-electronic detection in larger wavelength ranges, including infrared (IR) range. In embodiments, enhancement of the IR photoresponse and reduction of the response time have been observed in MWCNT films.

In embodiments, unsuspended MWCNT films have been used to detect IR and high bolometric response, as demonstrated at room temperature. A comparative study of suspended and unsuspended MWCNT film bolometers has demonstrated that the difference in the detector performance due to device suspension is minimal, which is in contrast to the SWCNT film bolometer case. The observed D* exceeding $3.3 \times 10^6$ cm $Hz^{1/2}/W$ with unsuspended MWCNT-film opto-electronic detectors is a factor of 7 higher than that obtained with suspended SWCNT films. The response time of about 1-2 millisecond with MWCNT opto-electronic detectors is more than an order of magnitude shorter than that of SWCNT bolometers.

Some embodiments of the present invention relate to the use of MWCNT films combined with grapheme flakes to provide higher photoresponse. In embodiments, the grapheme added in MWCNT films changes the inter-tube connection and provides optimized photoresponse with higher detectivity up to $1.5 \times 10^7$ cm $Hz^{1/2}/W$ at room temperature.

Some embodiments of the present invention relate to the use of individual MWCNT with specially designed asymmetric Schottky electrode configuration to efficiently harvest photocurrent. The photocurrent may not be efficiently collected in traditional individual CNT Schottky detector since the photon excited carriers are collected through the out-most layer, thus optimizing the photocurrent harvesting is expected to greatly enhance the performance. We have developed individual MWCNT with asymmetric electrode geometry by using two Schottky contacts, one on the sidewall of MWCNT and the other on the end providing direct contact to the inner shells. This asymmetric geometry assists the transport of the charge carriers from inner shells to the electrode so as to improve the photocurrent collection efficiency. Furthermore, elimination of the Ohmic contact typically used in conventional Schottky devices will considerably reduce the thermal link of the MWCNT detector element to the environment, resulting in considerably elevated temperature in the element and enhanced photocurrent generation as the thermal energy exceeds the exciton binding energy, which can be as small as few to few tens of meV in the MWCNT with large diameters. With this novel design of the electrodes for photocurrent harvesting, significantly enhanced photoresponsitvty (up to $10^4$ A/W, which is at least two orders of magnitude higher than the conventional CNT Schottky IR detectors so far reported) and detectivity D* up to of $6.2 \times 10^9$ cm·$Hz^{1/2}/W$ has been obtained at room temperature. This D* is not only several orders of magnitude better than the best reported on all CNT IR detectors, but also an order of magnitude higher than that of the commercial VOx-based uncooled IR detectors.

BRIEF DESCRIPTION OF THE DRAWINGS

The present invention is described in detail below with reference to the attached drawing figures, wherein:

FIG. 11A is a comparison of the A value as a function of MWCNT film thickness before and after thermal annealing, in accordance with an embodiment of the invention;

FIG. 11B depicts A value as a function of thickness/diameter ratios of MWCNT and SWCNT films, in accordance with an embodiment of the invention;

FIG. 21A depicts Sv as a function of frequency for MWCNT and MWCNT/G films, in accordance with an embodiment of the invention; and FIG. 21B depicts Vn vs. Current for MWCNT/G films, in accordance with an embodiment of the invention.

DETAILED DESCRIPTION OF THE INVENTION

The subject matter of the present invention is described with specificity herein to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Embodiments of the present invention are generally directed to using MWCNTs in bolometers for high-sensitivity detection. MWCNT films were prepared in a vacuum filtration process and SWCNT films were prepared for comparison using SWCNTs and MWCNTs (Shenzhen Bill Technology Development Ltd., China). In embodiments, the diameter of a SWCNT is typically less than 2 nm while that of the MWCNT is around 40-60 nm. The unsuspended CNT films were transferred onto $SiO_2$/Si (001) substrates with 500 nm thick thermal oxide layer. Parallel channels were defined using electron beam lithography (EBL) before CNT-film transfer on the same type of substrates for suspending CNT films. The channel width and channel spacing are both around 0.5 μm. The overall EBL patterned area was about 270×270 μm$^2$. The average film thickness of SWCNT films was estimated to be about 80 nm using a KLA Tencor P-16 profiler. In some embodiments, MWCNT films are not continuous and the average thickness was estimated to be 100-200 nm. Suspension of MWCNT films with a thickness thinner than 100-200 nm may be challenging due to serious film deformation. Several samples were studied for each kind for consistency. The same electrode configuration was used for both suspended and unsuspended CNT films. Four Au (25 nm)/Ti (5 nm) electrodes were deposited on all substrates for four-probe transport measurements. In embodiments, the voltage electrodes spacing is about 0.35 mm and the width of all CNT films is about 0.3-0.4 mm. Thermal annealing of CNT films was made in a vacuum of $<5\times10^{-6}$ Torr at 400° C. for 90 minutes. The improvement of the temperature coefficient of resistance (TCR) on both SWCNT and MWCNT after annealing was attributed to an enhanced inter-tube coupling. IR radiation was provided by a xenon flash light (Stinger 75014, Streamlight, Inc.) with a near infrared filter (X-Nite1000C, LDP LLC; 1000 nm cutoff at 50%, 1300 nm passband>90%). IR power intensity was calibrated using a Thorlabs PM100D thermal powermeter. Noise property was examined using a SR760 spectrum analyzer. All measurements were performed in air at room temperature.

Figure 1:
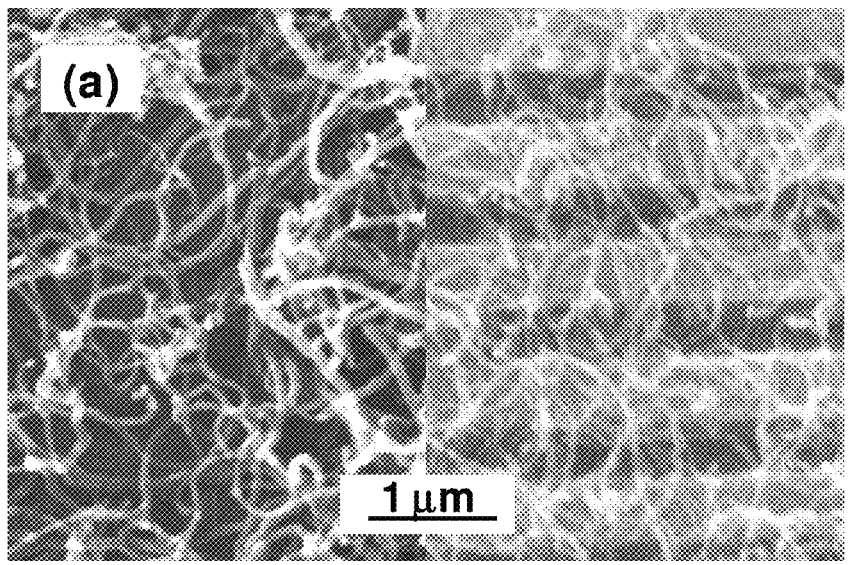
FIG. 1 is a scanning electron microscopy (SEM) image of unsuspended (left) and suspended (right) MWCNT films.
Figure 2:
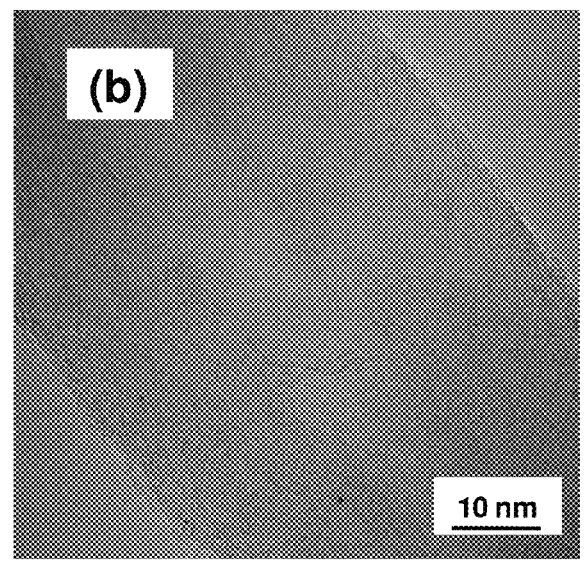
FIG. 2 is a transmission electron microscopy (TEM) image of a representative individual MWCNT, with a shell number of approximately 40-50.

FIG. 1 shows scanning electron microscopy (SEM) images of representative MWCNT films in the unsuspended (left) and suspended (right) forms, respectively. Unlike their SWCNT counterparts, the MWCNT films contain substantial uncovered substrate areas. This means the labeled thickness of MWCNT films has a large uncertainty. In addition, some minor deformation of recess is visible on suspended MWCNT films, which is similar to the SWCNT film case in the same thickness range. FIG. 2 includes a transmission electron microscopy (TEM) image of a representative individual MWCNT, which has a large hollow center of approximately 10-11 nm in diameter and contains approximately 40-50 CNT shells.

Figure 3:
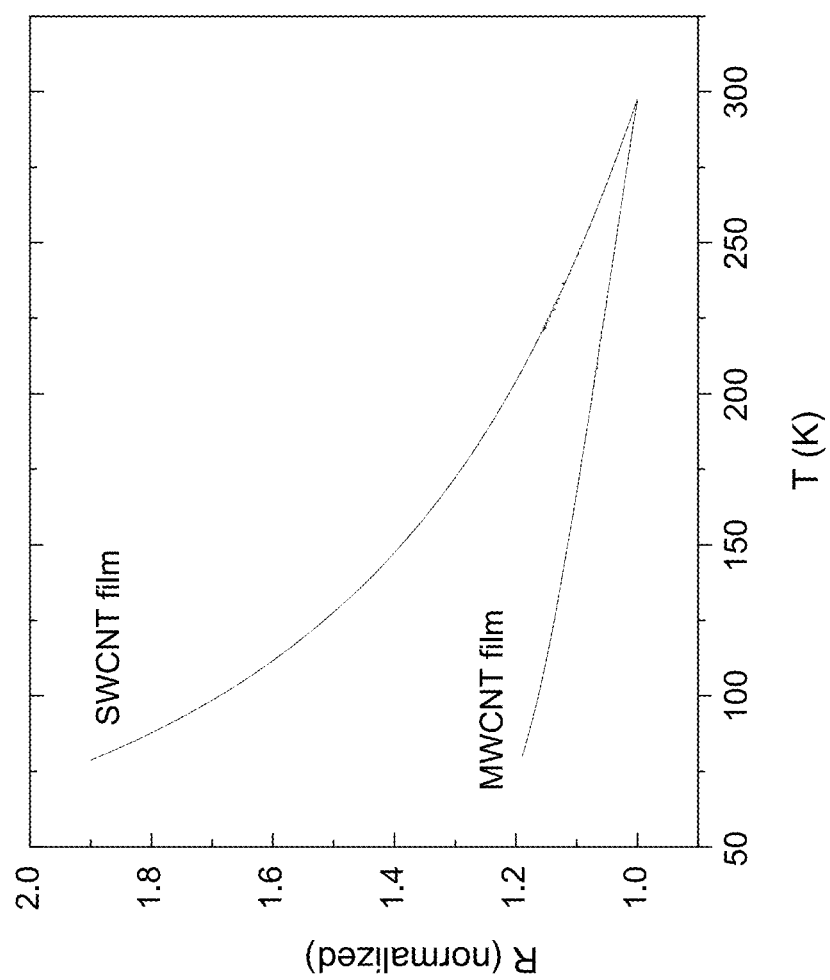
FIG. 3 is a graph depicting the resistance (R) vs. temperatures (K) of SWCNT films and MWCNT films.

In embodiments, the studied MWCNT films demonstrate semiconductive resistance-temperature (R-T) behaviors and representative curves as depicted in FIG. 3. Nevertheless, the increase in the resistivity of MWCNT films is much less than that of SWCNT films with decreasing temperature, as shown in FIG. 3. This may be expected considering a much smaller bandgap in MWCNTs. The reduced temperature dependence also implies smaller TCR absolute value in MWCNTs. For example, the TCR absolute value at room temperature for MWCNT films is about 0.07%/K, in contrast to approximately 0.17%/K for SWCNT films.

Figure 4:
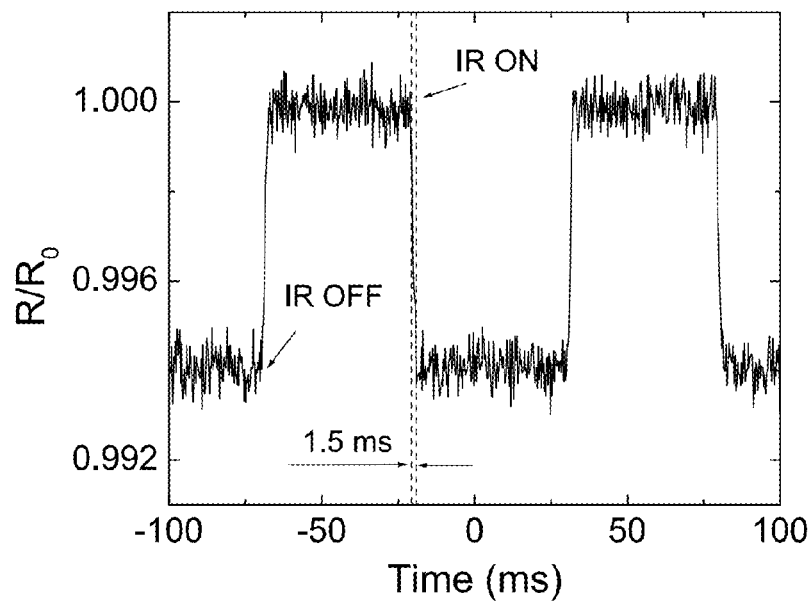
FIG. 4 is a chart depicting the photoresponse (R/R$_0$) of unsuspended MWCNT film, f=10 Hz, in IR ~3 mW/mm$^2$.
Figure 5:
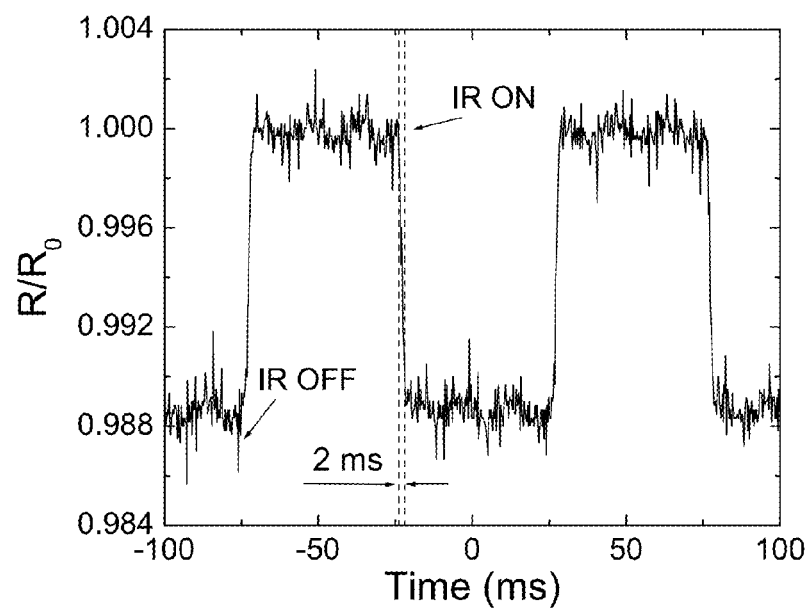
FIG. 5 is a chart depicting the photoresponse of suspended MWCNT film, f=10 Hz, in IR ~3 mW/mm$^2$.

FIGS. 4-5 generally compare the photoresponse $R/R_0$ of MWCNT films in unsuspended (FIG. 1) and suspended (FIG. 2) cases, where $R_0$ is the sample resistance before IR radiation was turned on and the change of the resistance caused by IR radiation is defined as $\Delta R = R - R_0$. For comparison, the results of their SWCNT counterparts are also included in FIG. 6 (unsuspended) and FIG. 7 (suspended).

As depicted in FIGS. 4-7, two major differences are visible between MWCNT and SWCNT films: 1) a significantly higher $\Delta R/R_0$, and 2) a much shorter response time in the cases of MWCNT. The $\Delta R/R_0$ for MWCNT samples is typically in the range of a few percents, which is more than one order of magnitude higher than that of suspended SWCNT films and two orders of magnitude higher than the unsuspended SWCNT films at a comparable IR power. Considering a lower TCR absolute value in MWCNTs, the much enhanced photoresponse of MWCNT films may be attributed to the naturally suspended inner CNT shells, which may provide an ideal configuration to enhance the bolometric effect by improving light absorption and reducing thermal link. Physical suspension of the films in both MWCNT (FIG. 5) and SWCNT (FIG. 7) cases results in a further improvement of $\Delta R/R_0$ as compared to their unsuspended counterparts.

The improvement is however much more pronounced (by a factor of 5-10) in SWCNT film than in MWCNT film (by a factor of 2). Considering the same physical suspension structures employed for both SWCNT and MWCNT films, it is plausible to argue that the proportions of the reduction of direct thermal link to substrate are comparable in the two suspended cases. The much greater improvement of $\Delta R/R_0$ by suspending SWCNT films therefore suggests the $\Delta R/R_0$ in unsuspended SWCNT film may contain a considerable portion of non-bolometric photoresponse, such as direct photoconductivity. The direct photoconductivity in SWCNT is fairly weak even under high intensity laser. The possible electron plasmon excitation may facilitate electron transfer to molecules attached to the CNT surface, leading to a rather large relaxation time (response time) on the order of several seconds. The low photoresponse and large response time observed on unsuspended SWCNT films is consistent with these characteristic features. However, direct photoconductivity may not play a significant role in unsuspended MWCNT films in which the bolometric response is significantly enhanced by naturally suspending CNT inner shells.

The other major difference between MWCNT and SWCNT films is in much shorter response time in the former case. For MWCNT films, the response time is in the range of 1.0-2.6 ms. In embodiments, the response time was measured from 10% to 90% magnitude change of $\Delta R/R_0$ with 10 Hz modulation (chopping) of the incident IR radiation. This is a significant improvement on the response time of 40-60 ms of the suspended SWCNT films and several seconds for the unsuspended SWCNT films.

To better understand the observed IR photoresponse of CNT films, the measured photoresponse was compared with the theoretical calculation based on the bolometric heat balance equation with the measured R-T curve and the temperature dependence of the specific heat of the films. The bolometric heat balance equation with a constant bias current can be written as follows:

$$mC\frac{dT}{dt} = \eta P H(t) + I^2 R - G(T - T_0)$$ (Equation 1)

where T and $T_0$ are the film and heat sink temperatures, respectively, m and C are the mass and specific heat of the film, $\eta$ is the radiation absorbance of the film, P is the incident radiation power, I is the bias current, R is the resistance of the film, G is the total thermal conduction coefficient, and H(t) is a rectangular pulse with H(t)=1 when the incident radiation is on and H(t)=0 when the incident radiation is off. The heat sink temperature is assumed to be the same as the ambient temperature, i.e. $T_0 \approx 300K$ for the case of this experiment. Note that the linear T-dependence term of the thermal energy loss due to the blackbody radiation of the film is included in the term of G and the higher-order terms of the energy loss were neglected in Equation 1. The T-dependence of R was obtained by fitting the measured R-T curves in FIG. 3. For SWCNT films, the temperature increase $\Delta T$ of the photoresponse is much smaller than $T_0$ and, therefore, only the linear term of the T-dependences of R is needed here, i.e.

$$\frac{\Delta R}{R_0} = \frac{R - R_0}{R_0} \cong -\alpha \frac{\Delta T}{T_0}$$ (Equation 2)

where $R_0 = R(T_0)$ and $\alpha \approx 0.48$ at $T_0 = 300K$. For MWCNT films, the fitting of the measured R-T curve near $T_0 = 300K$ yields a similar linear T-dependence but $\alpha \approx 0.23$. For the T-dependence of C, the published data was used. Near $T_0 = 300K$, it can be approximated for both SWCNT and MWCNT that $$C(T) \approx C_0 + C_1(T - T_0)$$ (Equation 3)

where $C_0 \approx 650$ J/(kg·K) and $C_1 \approx 2.0$ J/(kg·K$^2$) for SWCNT while $C_0 = 450$ J/(kg·K) and $C_1 \approx 1.5$ J/(kg·K$^2$) for MWCNT. With Equations 2 and 3, the dynamics of the bolometric response can be solved from Equation 1. In this experiment, the modulation period of the incident radiation is much larger than the response time of the photoresponse (see FIGS. 4-7). In this situation, the photoresponse has enough time to reach its maximal temperature change (steady state) and follows the rectangular pulse of the incident radiation. This maximal temperature change obtained from Equation 1 is then:

$$\left(\frac{\Delta T}{T_0}\right)_{max} = \frac{\eta P + I^2 R_0}{G T_0 + \alpha I^2 R_0}$$ (Equation 4)

and the response time can be written as $$\tau_s = a_1 \left[ a_2 + \left(\frac{\Delta T}{T_0}\right)_{max} \right] \left(\frac{\Delta T}{T_0}\right)_{max}$$ (Equation 5)

where $a_1 = mC_1 T_0/(\eta P + I^2 R_0)$ and $a_2 = C_0/(C_1 T_0)$. Note that the values of $a_1$ and $a_2$ do not depend on whether a CNT film is unsuspended or suspended. The suspension of a CNT film only reduces the thermal conduction G. Let $\gamma_{su}$ and $\gamma_{un}$ be the maximum values of $(\Delta T/T_0)_{max}$ of a suspended and unsuspended CNT films while $\tau_{su}$ and $\tau_{un}$ are the response time of the suspended and unsuspended films, respectively. If a pair of unsuspended and suspended CNT films have otherwise similar physical characteristics, which is the case of this experiment, the ratio of their time constants is then $$\frac{\tau_{su}}{\tau_{un}} \cong \frac{(a_2 + \gamma_{su})\gamma_{su}}{(a_2 + \gamma_{un})\gamma_{un}}$$ (Equation 6)

This scaling relationship can be conveniently used to verify the bolometric effect of a CNT film by comparing the measured photoresponses between a suspended and unsuspended film.

In the case of MWCNTs, we have $\gamma_{su} \approx 0.28$ extracted from FIG. 5 and $\gamma_{un} \approx 0.24$ from FIG. 4. Based on the measured specific heat, $a_2 \approx 1$ for MWCNT. The ratio of the response time between the suspended and unsuspended MWCNT films calculated from Equation 6 is then $\tau_{su}/\tau_{un} \approx 1.2$. On the other hand, the value of this ratio directly calculated with the measure response time from FIGS. 4-5 is around 1.3. The observed photoresponses on the MWCNT films therefore agree well with the model, which confirms that the observed photoresponse of MWCNT films is dominantly a bolometric effect and a reduction of the thermal link in suspended MWCNT films leads to a smaller G and therefore longer response time.

Figure 6:
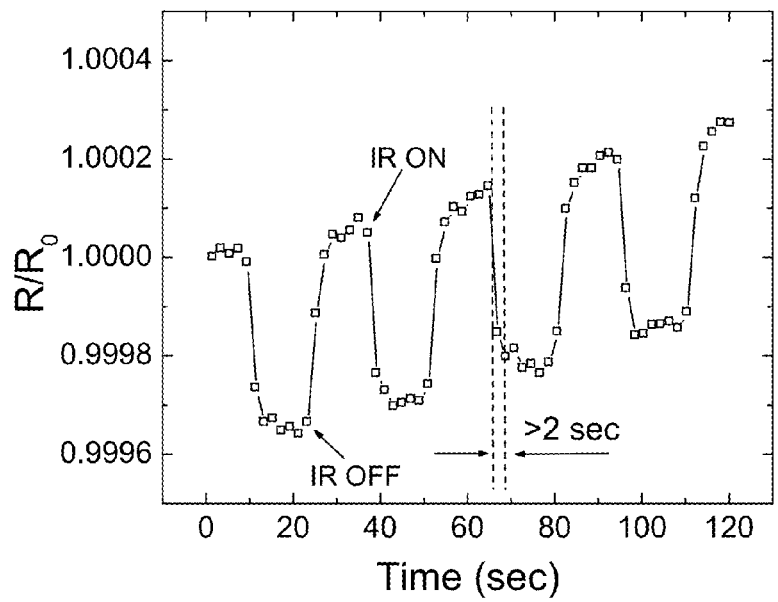
FIG. 6 is a chart depicting the photoresponse of unsuspended SWCNT film, f=1/30 Hz, in IR ~3.5 mW/mm$^2$.
Figure 7:
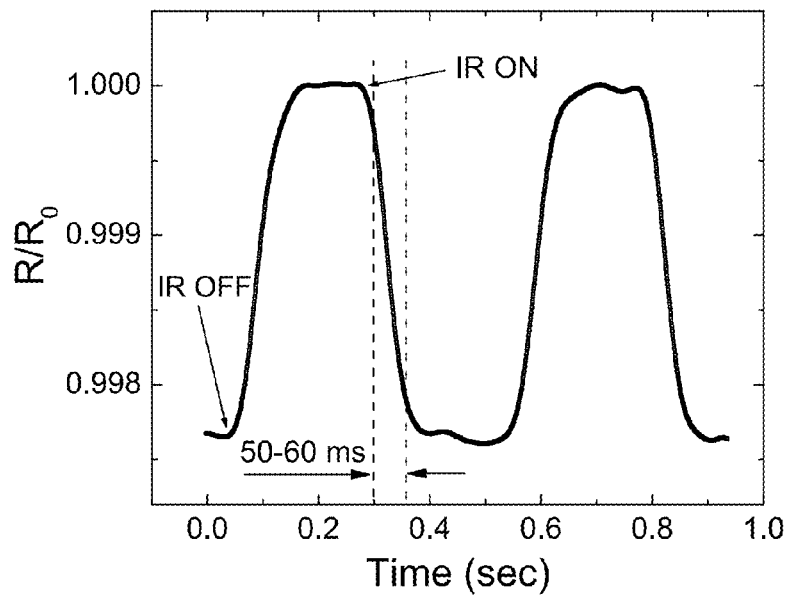
FIG. 7 is a chart depicting the photoresponse of suspended SWCNT film, f=2 Hz, in IR ~3.5 mW/mm$^2$.

In the case of SWCNTs, the maximal photoresponses in FIGS. 6-7 are $\gamma_{un} \approx 0.8 \times 10^{-3}$ and $\gamma_{su} \approx 0.5 \times 10^{-2}$, respectively. From the measured specific heat of SWCNT, $a_2 \gg \gamma_{su}$. The ratio of the response time calculated from Equation 6 is then $\tau_{su}/\tau_{un} \approx 6.3$. A direct calculation of $\tau_{su}$ and $\tau_{un}$ from FIGS. 6-7, however, suggests that $\tau_{su}/\tau_{un} \ll 1$. The observed photoresponse in SWCNT films is therefore inconsistent with the bolometer model. Note that the response time of a bolometer is the consequence of the thermal dissipation and is inversely proportional to the thermal conduction. Since the suspension of the film reduces the thermal conduction, the increase of the photoresponse after the suspension is agreeable with bolometric effect being dominant. The photoresponse of the unsuspended SWCNT film is therefore most probably not a bolometric effect, which may be affected by the large surface area and massive inter-tube junctions inherent to SWCNT films.

Enhanced bolometric photoresponse is observed on unsuspended MWCNT films as compared to their SWCNT counterparts. Although a systematic investigation of the photoresponse may reveal more, this study reveals a critical effect of the microscopic configuration of CNTs to the photoresponse. The naturally suspended CNT inner-shell configuration in a MWCNT may provide several favorable effects to enhanced bolometric photoresponse including high radiation absorbance per tube, engineered thermal link to environment, reduced surface area and inter-tube junctions.

Figure 8:
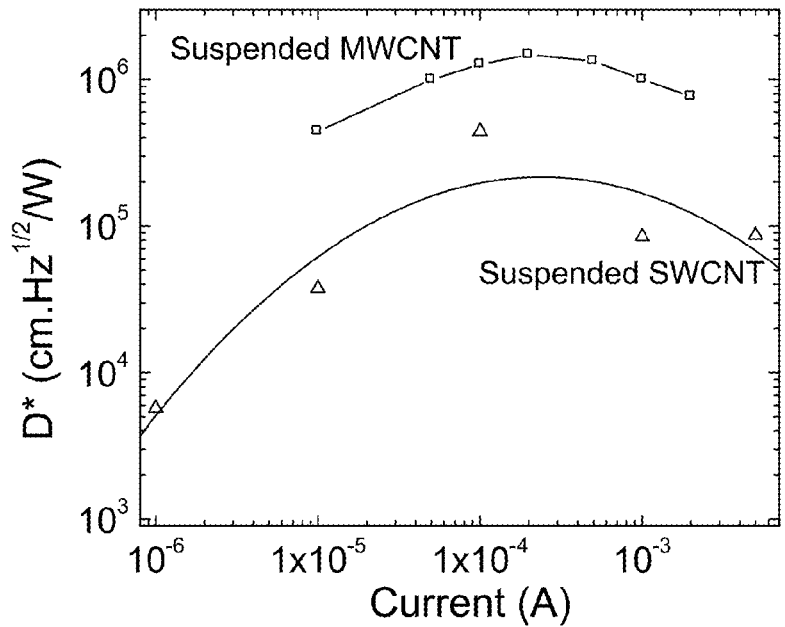
FIG. 8 is a chart depicting D* as function of bias current I (A) for suspended MWCNT (square) and SWCNT (triangle) films, with modulation frequencies of 10 Hz for MWCNT films and 2 Hz for SWCNT films.

FIG. 8 plots the detectivity as a function of the bias current I for the suspended MWCNT and SWCNT films. The detectivity is defined as $D^* \approx R_v \sqrt{A_d}/V_n$, where $A_d$ is the active detection area, $V_n$ is the root-mean-square noise voltage per unit bandwidth, and $R_v = \Delta V/\Delta P$ is the responsivity that is defined as the ratio of the voltage change ($\Delta V$) and the power ($\Delta P$) of incident IR radiation. The modulation frequencies of the incident radiation were 10 Hz for MWCNT films and 2 Hz for SWCNT films, respectively. The D*-I curves show a qualitatively similar parabola shape for both MWCNT and SWCNT films, which is similar to that reported in traditional VOx uncooled IR bolometers [16, 24]. The D* peak of the suspended MWCNT film (square) is $\sim 1.5 \times 10^6$ cmHz$^{1/2}$/W, which is more than three times higher than the peak $D^* \sim 4.5 \times 10^5$ cmHz$^{1/2}$/W for the suspended SWCNT film (triangle). This improved D* may be a consequence of the naturally suspended multi-shell structure of MWCNT, as discussed above.

A similar variation trend was also observed on unsuspended MWCNT film (not shown) with a peak $D^* \sim 8.3 \times 10^5$ cmHz$^{1/2}$/W. For CNT, the major noise has been reported to be 1/f noise at low frequencies. The $V_n$ is expected to increase with bias current at a fixed frequency, which has been confirmed experimentally. The parabola shape of the D* vs. current curves is attributed to self heating and TCR decrease at higher dc bias current in VOx bolometers. At higher current the self heating leads to $R_v$ drifting downwards from the linear I-dependence, causing D* decreasing after reaching a peak at certain bias current. In both suspended and unsuspended CNT films the $R_v$ indeed shift downwards from the linear $R_v$ vs I curves at higher bias, indicating a similar mechanism to that in $VO_x$ bolometers. In the unsuspended MWCNT film case the peak D* appears at much higher bias current, this might be induced by the reduced self-heating with improved thermal link to environment.

Figure 9:
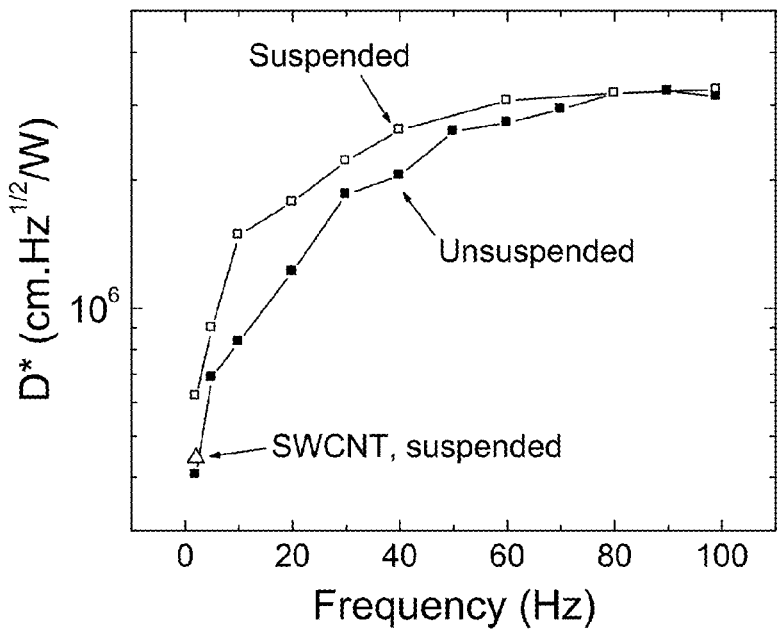
FIG. 9 is a chart depicting D* as function of modulation frequency for unsuspended MWCNT film (solid squares, I=2 mA) and suspended MWCNT film (open squares, I=200 μA), with an open triangle showing the D* of suspended SWCNT film at f=2 Hz, and an IR intensity of 0.3 mW/mm$^2$ applied in all measurements.

The frequency dependence of D* at IR power intensity of 0.3 mW/mm$^2$ is depicted in FIG. 9 for both suspended and unsuspended MWCNT films. It should be pointed out that this curve can't be obtained on suspended SWCNT films due to the limitation of large response time, thus only one point (open triangle) was added to represent the D* of suspended SWCNT film at 2 Hz. The curves for suspended/unsuspended MWCNT films show a same trend that D* increases monotonically with f at lower frequencies, which is expected as a consequence of monotonically decreasing $V_n \propto 1/f^{1/2}$ and weak frequency dependence of $R_v$. This variation is consistent with previously reported results in conventional vanadium oxide based bolometers. Since 1/f noise dominates the noise spectrum at low frequencies below the corner frequency, $V_n$ is expected to saturate at the thermal noise when frequency is higher than the corner frequency. On the other hand, $R_v$ decreases very slowly with increasing frequency due to the small response time, the D* is expected to eventually saturate at a certain value when $V_n$ almost reaches its saturation at near the corner frequency. Despite a slightly lower D* for unsuspended MWCNT film, a maximum value of about $3.3 \times 10^6$ cmHz$^{1/2}$/W was observed for both suspended and unsuspended MWCNT samples at around 80-90 Hz. The comparable performance of D* and response time in suspended and unsuspended MWCNT films suggests the natural suspension of inner CNT shells plays a dominant role in enhancing the bolometric photoresponse. Moreover, the saturated high D* value on MWCNT films is more than seven times of the best D* of $4.5 \times 10^5$ cmHz$^{1/2}$/W [open triangle] so far achieved on suspended SWCNT film bolometer, which further confirms the advantage of MWCNT film for bolometer applications.

In embodiments, the naturally-suspended inner CNT shells structure in MWCNT provides a unique microscopic configuration desired for a nanoscale bolometer with high photon absorption and engineered thermal conduction. Significantly improved IR photoresponse, fast response time, and high bolometer detectivity have been observed in both suspended and unsuspended MWCNT films as compared to their SWCNT counterparts. The observed high detectivity D* and short response time around 1-2 millisecond represent the best so far achieved on CNT film bolometers. These results suggest MWCNT film based infrared bolometers may become competitive for practical application of uncooled infrared detection with further optimization.

1/f Noise and Temperature Coefficient of Resistance in MWCNT and SWCNT

The 1/f noise and temperature coefficient of resistance (TCR) are investigated in multiwall carbon nanotube (MWCNT) film bolometers since both affect the bolometer detectivity directly. A comparison is made between the MWCNT film bolometers and their single-wall carbon nanotube (SWCNT) counterparts. The intrinsic noise level in the former has been found at least two orders of magnitude lower than that in the latter, which outweighs the moderately lower TCR absolute values in the former and results in higher bolometer detectivity in MWCNT bolometers. Interestingly, reduced noise and enhanced TCR can be obtained by improving the inter-tube coupling using thermal annealing in both SWCNT and MWCNT films, suggesting much higher detectivity may be achieved via engineering the inter-tube coupling.

Carbon nanotubes (CNT) are promising materials for uncooled infrared (IR) detector applications due to their moderate band gap ~0.4-2.0 eV and high absorption efficiency in the IR band. While most previous research has focused on single-wall carbon nanotubes (SWCNT) IR detectors our recent work on multiwall carbon nanotubes (MWCNT) bolometers has shown much enhanced detectivity D* up to $3.3 \times 10^6$ cm Hz ½ W-1, which is nearly an order of magnitude higher than that of their SWCNT counterparts. It should be realized that this D* value is still about two orders of magnitude smaller than the typical D* of $10^8$ cm Hz ½ W-1 in convectional vanadium oxide (VOx) uncooled IR bolometers. Further improvement of MWCNT film bolometers requires identification of the performance limiting factors and understanding the physics underlying the limiting mechanisms. D* is affected directly by two parameters of the bolometers: noise and the temperature coefficient of resistance (TCR=dR/(RdT), R is sample resistance and T is temperature). In fact, D* is linearly proportional to the absolute value of TCR and inversely proportional to the noise voltage. This makes understanding the noise and TCR imperative to the development of high sensitivity CNT bolometers. In SWCNT films it has been reported that both noise and TCR are affected by film thickness, since electrical and thermal transport pathways are dictated by the percolation through CNT networks, which varies with film thickness. A similar correlative study of noise and TCR on MWCNT films is necessary and important to the optimization of MWCNT bolometers. Motivated by this, we have investigated the noise and TCR in MWCNT films with different thicknesses. Thermal annealing was applied to improve the inter-tube transport properties in the MWCNT films and a comparison made with their SWCNT counterparts.

Figure 10A:
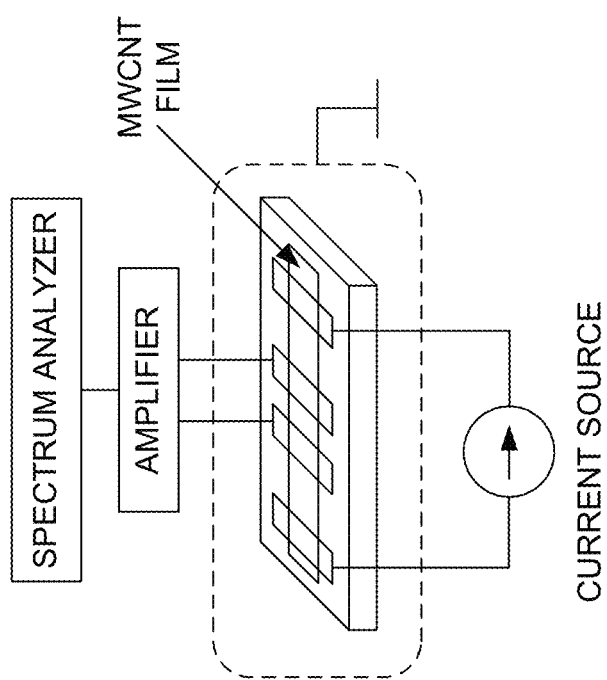
FIG. 10A is a diagram of an exemplary sample and setup for measuring noice, in accordance with an embodiment of the invention.

MWCNTs were synthesized using chemical vapor deposition and MWCNT films were fabricated using vacuum filtration, the fabrication details have been reported elsewhere. The typical diameter of the MWCNT is in the range of 40-60 nm. Films with different thicknesses in the range of 100-800 nm were obtained by controlling the volume portion of the MWCNT suspension used for vacuum filtration. The MWCNT films were transferred onto Si substrates with a 500 nm thick thermal oxide layer. The average film thickness was measured using a KLA Tencor P-16 profiler. Four Au/Ti electrodes were deposited on all substrates using e-beam evaporation prior to the film transfer for four-probe measurement. The spacing between two voltage electrodes was about 0.35 mm and the width of all films was fixed to be about 1 mm. All samples were then annealed in a vacuum of $<5\times10^{-6}$ Torr at 400° C. for 90 min. Resistance versus temperature (R-T) curves were measured in the range from room temperature to about 80 K. The voltage noise spectra measurement system consisted of a SR760 spectrum analyzer, a Keithley 224 current source and a SR560 low noise voltage preamplifier. The MWCNT film sample was mounted in a grounded box for noise measurement and the setup is illustrated in FIG. 10A. A frequency scan range of 1-100 Hz was selected for all the noise measurements, which were performed at room temperature in air.

Figure 10C:
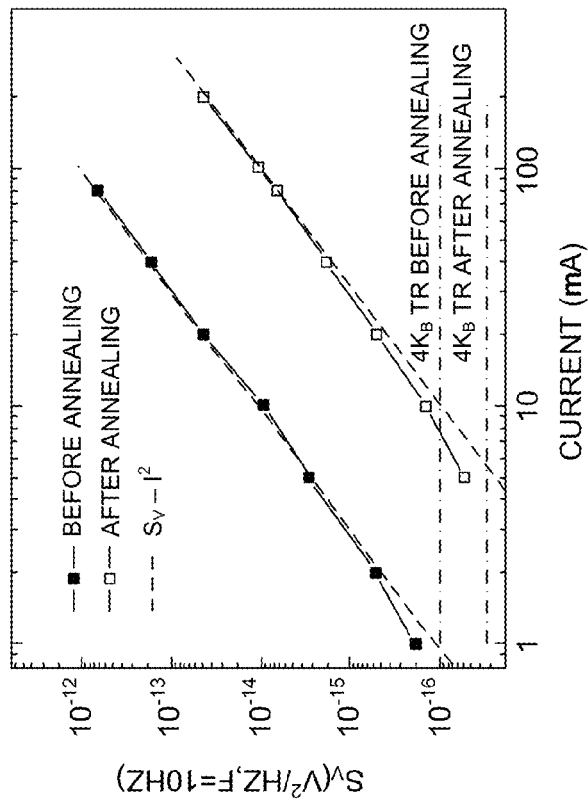
FIG. 10C is a chart depicting $S_v$ (f=10 Hz) vs. I for the exemplary MWCNT film of FIG. 10B, before and after thermal annealing, in accordance with an embodiment of the invention.
Figure 10B:
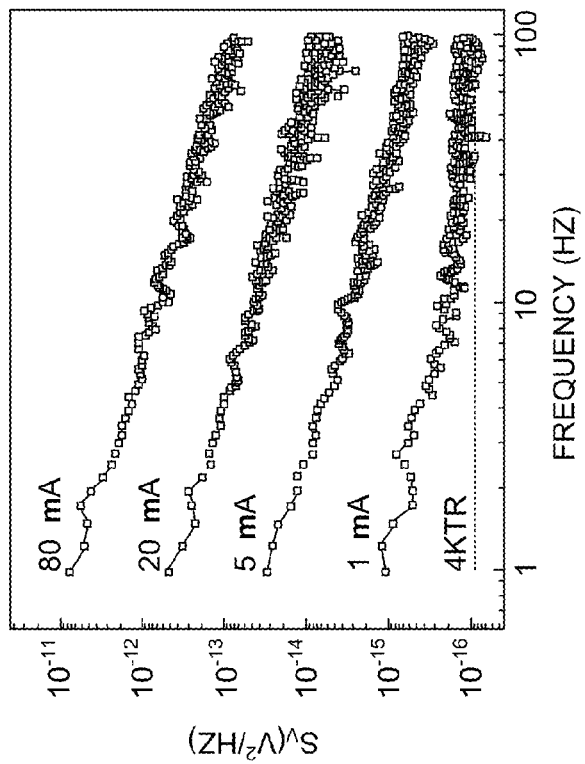
FIG. 10B is an exemplary $S_v$ vs. f spectra of a 200 nm thick MWCNT film before thermal annealing, in accordance with an embodiment of the invention.

The low-frequency (f) noise in MWCNT films is predominantly 1/f noise, which is consistent with the previous reports on CNTs. The noise power spectra SV as a function off at several bias currents for a representative 200 nm thick MWCNT film before annealing are shown in FIG. 10B. The sample resistance before annealing is about 5.9 k_. The dashed line represents the thermal noise 4 kBT R, where kB is the Boltzmann constant. The current dependence of SV can be derived from the equation $SV=V2n=AV2/f\beta$, where noise amplitude coefficient A is a critical parameter to evaluate the noise level, $\beta$ is close to 1, Vn is noise voltage and V≈RI is the electrical voltage across the sample in the direction of bias current I. The calculated noise amplitude coefficient A for this 200 nm thick MWCNT film is about $3.6\times10^{-11}$, with exponent $\beta\approx1.05$, which confirms the low-frequency noise in MWCNT film is predominantly 1/f noise. In FIG. 10C, the noise spectra at a fixed frequency of 10 Hz before annealing are plotted as function of different bias currents (the solid dots). This SV (f≈10 Hz) versus I curve is almost linear in the log-log coordinates and fits the SV∝I2 very well, except for the small deviation at low bias current. This is expected since SV is approaching the thermal noise limit and no longer follows the I2 rule. After annealing, the noise spectra SV of the MWCNT sample (not shown) exhibit a similar f-dependence, as illustrated in FIG. 10B, with a comparable $\beta$ about 1.03. Nevertheless, the sample resistance was reduced to about 1.9 k_ after annealing, which could be attributed to an improved inter-tube coupling through thermal annealing, which has been confirmed in SWCNT film. Although it is unclear what has happened exactly at microscopic scales, a better inter-tube charge transport may be attributed to the formation of a better inter-tube connection on cleaned CNT surfaces and/or to the formation of covalent bonds between different CNTs via thermal annealing. The SV (f=10 Hz) versus current curves before (solid) and after (open) annealing are compared in FIG. 10C. While a similar trend is observed in the two cases, the overall noise level is significantly lower after annealing. This results in a greatly reduced noise amplitude coefficient A, by an order of magnitude, in the annealed sample. This observation indicates a critical effect of the inter-tube connection on the CNT film noise level. Therefore improving the inter-tube connection, by means such as thermal annealing, is a key to the reduction of the noise in MWCNT films. In previous reports, systematic research made by Collins et al confirmed the 1/f noise in individual, film and bulk mat SWCNTs; in the MWCNT case, Ouacha et al confirmed the 1/f noise in an individual MWCNT, while the noise in two crossing MWCNTs deviated from 1/f noise, with a larger exponent of $\beta\approx1.5$. Our results confirm the noise in MWCNT film is still basically 1/f noise. A CNT film can be treated as a percolation system, and the percolation threshold is approached at small thicknesses of a few layers of CNTs. To extract the percolation effect on the electron transport, and hence A in MWCNT films, a detailed comparison of the A values at different thicknesses is shown in FIG. 11A for the MWCNT film samples before and after annealing. FIG. 11A reveals two interesting trends: that the A value decreases with increasing thickness and that it further reduces after thermal annealing, both are consistent with the observations made on SWCNT films. The former may be attributed to the percolation effect in CNT films. According to Hooge's noise model, the noise amplitude coefficient is inversely proportional to the total charge carrier number, thus the increased total charge carrier number in thicker films will lead to a decrease of A. In a similar argument, the decrease of the A value after thermal annealing can also be explained as a result of enhanced conductivity through improved inter-tube coupling. It has been reported that the resistance of the CNT films is dominated by the intertube junction resistance, thus any improvement on the inter-tube electric coupling will lead to a decrease of the total resistance of the film. It should be noted that a much more significant decrease of A is observed on thinner MWCNT films, which indicates that the effect of the inter-tube junctions at a thickness close to the percolation threshold plays a more critical role in the transport properties of MWCNT films. The inset in FIG. 11A shows the exponent β versus thickness before and after annealing. β is in the range of 0.97-1.09 before annealing, and changes to a much narrower range of 1.03-1.05 after annealing. This suggests that poor inter-tube connection also adds to the range of data scattering in the 1/f noise spectra. FIG. 11B compares the A value in MWCNT films with their SWCNT counterparts. It has been reported in previous literatures that in thicker SWCNT films, such as 50-100 nm thick, the A value is typically on the order of 10-12, which is comparable to the A ~1×10−12 obtained on the 800 nm thick MWCNT film (FIG. 11A). Previous reports have suggested that CNT film may be treated as a percolation system in which the electron transport is affected by the microscopic dimension (i.e. diameter and length) of individual constituent CNTs at a given macroscopic dimension. For films with a large difference in the diameter of the constituent individual CNTs, it may be more logical to make the comparisons using the thickness/diameter ratio, instead of using the CNT film thickness. This will allow a comparison of the SWCNT and MWCNT films in a similar percolation state. The specified average diameter of the SWCNTs used in our experiment is about 1.1 nm and an average diameter ~50 nm is used for evaluating MWCNT films. As shown in FIG. 11B, the A value of the MWCNT films is at least two to three orders of magnitude smaller than that of their SWCNT counterparts at a comparable thickness/diameter ratio. This result is not surprising considering a higher electrical conductivity, and correspondingly more charge carriers, in MWCNTs as a consequence of a much smaller band gap in MWCNTs.

Figure 12B:
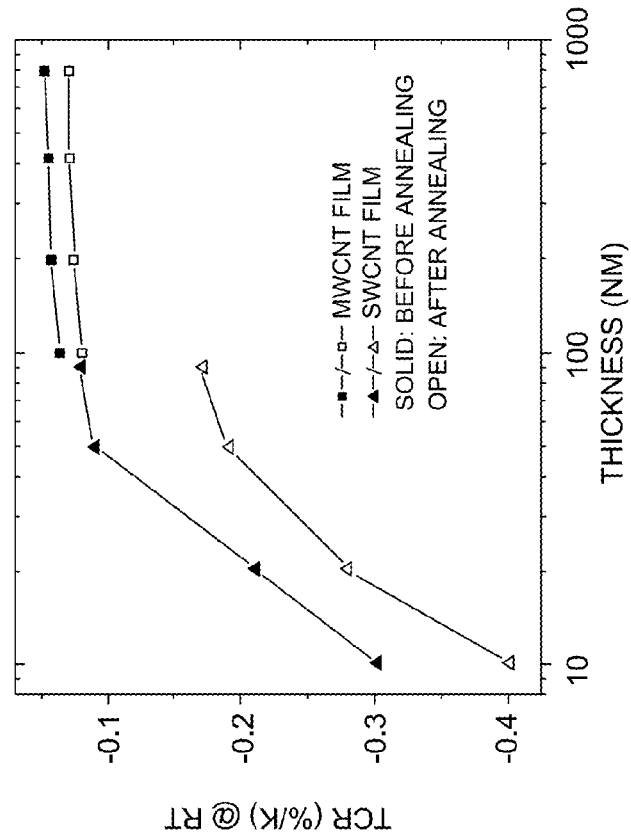
FIG. 12B depicts TCR vs. thickness for MWCNT and SWCNT films with different thicknesses, in accordance with an embodiment of the invention.
Figure 12A:
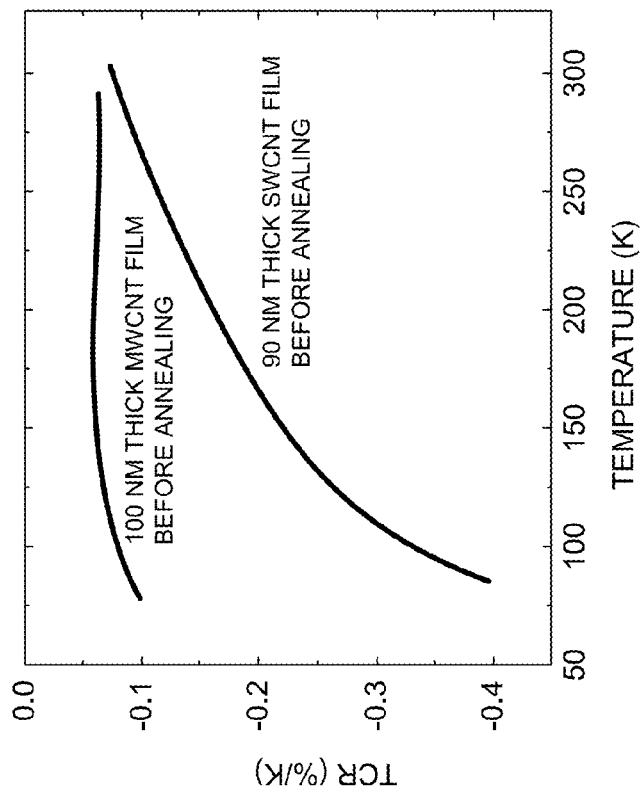
FIG. 12A depicts TCR as a function of temperature for a 90 nm thick MWCNT film and a 100 nm thick MWCNT film before annealing, in accordance with an embodiment of the invention.
Figure 12C:
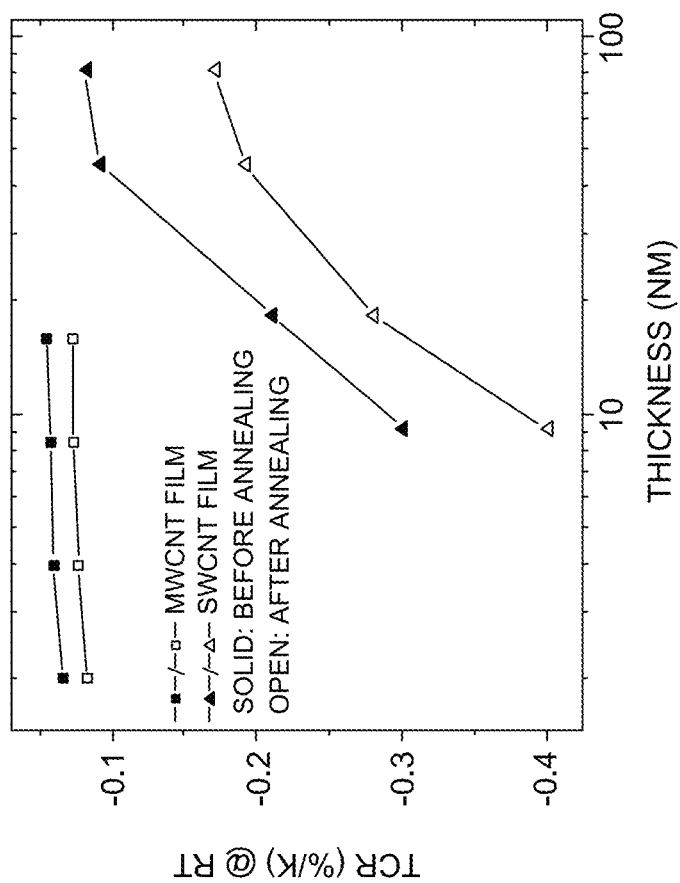
FIG. 12C depicts TCR vs. thickness/diameter ratios for SWCNT and MWCNT films, in accordance with an embodiment of the invention.

The lower noise in MWCNT films is at a cost of lower TCR value because the film material is more 'metallic' or less 'semiconducting'. A comparison of the TCR values of the MWCNT and SWCNT films is shown in FIGS. 12A-12C. All the MWCNT films measured in this experiment show higher resistances at lower temperatures, resulting in negative TCR values. The TCR versus T curve of a representative ~100 nm thick MWCNT film is compared with that of a SWCNT film with comparable thickness ~90 nm in FIG. 11A. A much larger increase of the absolute TCR value at lower temperature is observed in the SWCNT film, which is expected due to the larger band gap of SWCNT. After thermal annealing, the TCR of all CNT films were considerably improved (larger absolute value). In a CNT film, the overall resistance R consists of two parts: $R_{CNT}$ for the individual CNT resistance and $R_J$ for the inter-tube junction resistance. If we consider a simple model where the two are in series then $R=R_{CNT}+R_J$. The value of the dR/R in TCR can be much reduced from the intrinsic value of the individual CNT if $R_J$ is not negligible in R. In fact, $R_J$ dominates the overall R in the CNT films. This explains the low TCR absolute values in CNT films when the film thickness approaches the percolation limit. The observed TCR improvement in annealed CNT films suggests that thermal annealing is efficient in improving the TCR via improving the inter-tube coupling and thus reducing the $R_J$. Since the room temperature TCR value is important for uncooled bolometer applications, we only plotted the room temperature TCR values in FIG. 12B as a function of thicknesses. For MWCNT films, the TCR values increase about 30%-40% after annealing. This improvement is qualitatively consistent with that in the SWCNT film case, although the improvement in SWCNTs is more significant in the range of 30%-110% after annealing. The TCR absolute values increase with decreasing thickness for all MWCNT films, and this trend is consistent with the variation observed in the SWCNT films, which have been included in FIG. 12B for comparison. This behavior is again correlated to the percolation effect. The same TCR values plotted as a function of the thickness/diameter ratio are shown in FIG. 12C. At a comparable thickness/diameter ratio, the TCR absolute values of the SWCNT films are typically 4-6 times that of the MWCNT films. However, at a comparable thickness around 100 nm, which is widely used for SWCNT film bolometers due to the difficulties of handling samples with smaller thickness, the TCR of SWCNT film is only about twice that for MWCNT film (FIG. 12B). Assuming the active detector area and the bias current are constants, the bolometer detectivity can be evaluated from $D^* \propto RV/V_n \propto |TCR|/\sqrt{A}$, where the responsivity RV is proportional to the absolute value of TCR and noise voltage $V_n$ is proportional to the square root of the noise amplitude coefficient A. First, much improved $D^*$ can be obtained on the MWCNT film after annealing since the absolute value of TCR increases and the noise amplitude decreases after annealing. For example, for an annealed 200 nm thick MWCNT film the absolute value of TCR is about 1.34 times that before annealing (FIG. 12B) and the noise amplitude coefficient A is only about 9.3% of the original value (FIG. 11A). Thus $D^*$ after annealing is expected to be about $1.34/\sqrt{0.093} \approx 4.4$ times the original value before annealing. For a 200 nm thick MWCNT film with 1.5 mm long and 0.9 mm wide detection area, the $D^*$ value $\sim 5 \times 10^4$ cm Hz ½ W−1 was obtained at 200 µA bias current before annealing and then improved to about $1.45 \times 10^5$ cm Hz ½ W−1 at the same bias current after annealing, which is about 2.9 times the $D^*$ value before annealing. This improvement is qualitatively consistent with that expected on the basis of the noise and TCR analysis. On the other hand, MWCNT films have much higher $D^*$ than that of their SWCNT counterparts. This can be explained by the much reduced $V_n$ in the MWCNT films, which outweighs their slightly reduced absolute value of TCR as compared to the SWCNT film case, resulting in a higher ratio of the $|TCR|/A$ and therefore higher $D^*$. This result suggests the correlated behavior of noise and TCR determines the ultimate performance of CNT IR detectors. This higher $D^*$, in combination with a much shorter response time, makes MWCNTs promising for uncooled IR detector applications.

To conclude, the film thickness dependence of the 1/f noise and TCR have been studied in MWCNT and SWCNT films, and similar trends have been observed. These trends are consistent with that described by the percolation model and the result suggests the inter-tube coupling plays a critical role in the electrical transport properties of CNT films. Improving the inter-tube coupling through thermal annealing is shown to reduce the noise level and to enhance the absolute value of TCR. When compared at similar film thickness to CNT diameter ratio, MWCNT films have much a smaller noise amplitude level and slightly smaller absolute value of TCR than their SWCNT counterparts, resulting in considerably higher $D^*$ in MWCNT film bolometers.

Harvesting Photocurrent: Detectivity in Individual Multiwall Carbon Nanotube Infrared Photodetectors with Asymmetric Schottky Contacts Although carbon nanotubes (CNT) infrared detectors have been explored for many years, the sensitivity is still not competitive compared with traditional detectors and the reported maximum detectivity is at least two to three orders of magnitude lower. The efficiency of photocurrent harvesting is a limiting issue since the photon excited carriers must be collected through the out-most layer and then the high infrared absorption efficiency of CNT haven't been fully exploited. Here we report an extraordinary photocurrent harvesting configuration by using asymmetric Schottky contacts on individual CNT with one covering the sidewall and the other on the end of CNT, providing unbalanced build-in electric field to all inner CNT shells. The current responsivity of $1^{04}$ A/W is two orders of magnitude higher than previous reports on CNT infrared detectors, and the detectivity of $6.2\times1^{09}$ cm·$H^{z1/2}$/W is one order of magnitude higher than the convectional $V_{Ox}$ detector.

Carbon nanotubes (CNTs), in either single-wall (SWCNT) or multiwall (MWCNT) form, show outstanding absorption in infrared (IR) spectrum, making them promising candidates for IR detector applications. Many attempts have been made in fabrication and characterization of IR detectors by employing film and individual CNTs as the detection elements. Although promising results have been obtained, the figure-of-merit detectivity D* of the CNT IR detectors is several orders of magnitude lower than that of their conventional counterparts. On SWCNT and MWCNT film IR detectors, the best D* is $4.5\times10^5$ and $3.3\times10^6$ cm·$Hz^{1/2}$/W, respectively. These D* are at least two orders of magnitude lower than that of the uncooled vanadium oxide (VOx) IR bolometers typically on the order of $10^8$ cm·$Hz^{1/2}$/W. Individual CNT IR detectors are promising to achieving higher D* by removing the intertube junctions-obstacles for charge transport in CNT films, but little has been reported so far primarily because of the low IR responsivity on individual CNTs. Improving the performance of CNT IR detectors is necessary and imperative in order to make them competitive for practical applications.

High responsivity is a key to obtain high D*. The detectivity of an IR detector can be described as $$D^*=R_r\sqrt{A_d}S_n \qquad \text{Detectivity Equation}$$

where $R_r$ is the responsivity, $A_d$ is the detection area and $S_n$ is the noise level. While the dominant mechanism in the IR photoresponse of CNTs remains a debate and may depend on whether there is adequate external electric field to separate the excitons (i.e. electron-hole pairs), $R_r$ refers to the current responsivity $R_I=\Delta I/P$ in the photonic response case, such as CNT Schottky devices, with $\Delta I$ being the photocurrent induced by the charge carriers or the voltage responsivity $R_v=\Delta V/P$ in the case thermal response plays a dominant role and $\Delta V$ is the corresponding voltage change by the incident IR light. Here P is the power of incident IR light. Correpondingly, $S_n$ refers to the noise voltage $V_n$ for current bias and the noise current $I_n$ for voltage bias, respectively. High $R_r$ is a key to obtain high D*.

In the conventional CNT Schottky devices, the current response $\Delta I$ is the photocurrent primarily from the excitons separated by the build-in electrical potential at the metal-CNT Schottky interface that is paired with an Ohmic contact on the other side. The best current responsivity $R_I$ for individual Schottky CNT IR detectors are 23 A/W for MWCNT and 0.4 A/W for SWCNT, respectively, under near-IR radiation. For CNT films the $R_I$ is typically smaller than 1 mA/W under near-IR illumination. The photocurrent may not be efficiently collected in previous reports since the photon excited carriers must be collected through the out-most layer, thus optimizing the photocurrent harvesting is expected to greatly enhance the performance. In the thermal case, considerable voltage responsivity $R_v$ can be detected only if the SWCNT detection element is suspended to reduce its thermal link to the environment. It is therefore not surprising that enhanced photoresponse could be obtained in MWCNTs due to the natural suspension of the inner CNT shells. So far the $R_v$ for individual CNT bolometers has not been reported since suspending individual CNTs is not trivial and the large metal contacts employed may provide efficient thermal links to diminish the $R_v$. For the CNT film IR bolometers, the best reported $R_v$ of $\sim10^3$ V/W at room temperature is still an order of magnitude lower than the $10^4$ V/W of conventional uncooled VOx bolometers, as the overall performance is limited by the intertube junctions. While further improvement of the intertube junctions in CNT films is important, exploration of new schemes to achieve high sensitivity in individual CNT IR detectors will provide in-depth understanding of the limiting factors on the $R_r$ in these detectors.

Individual MWCNTs with Different Electrode Configurations

Figure 13A:
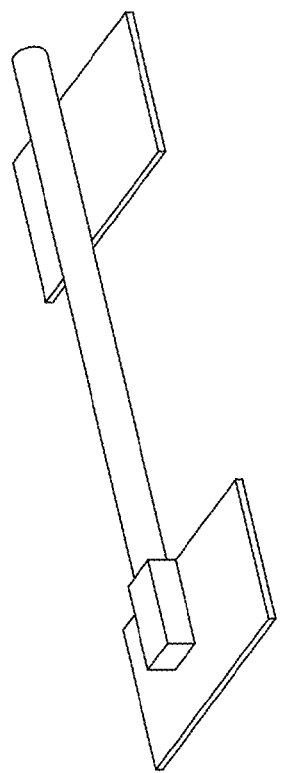
FIG. 13A depicts a perspective view of individual MWCNT with asymmetric electrodes, in accordance with an embodiment of the invention.

We have explored two schemes on individual MWCNTs. One employs a pair of symmetric Ohmic contacts (Pd) as bolometers and the other, a pair of asymmetric Schottky contacts (Au/Ti) as photonic detectors. In the former, no detectable responsivity was obtained, which may be attributed to the efficient thermal links by the large Ohmic contacts although the inner CNT shells are naturally suspended. In the latter, one Schottky contact was made on the sidewall and the other, on the end of the MWCNT to collect photocurrent from all inner CNT shells. The 3D diagrams of the device are shown in FIGS. 13A and 13B. By selecting the asymmetric geometry, the photocurrent generated at the two Schottky contacts will not be completely canceled. It is well known that the CNT inner shells are naturally suspended and incommensurate in MWCNTs, resulting in much hindered electrical and thermal transport along the radial direction as compared to the axial direction. The direct contact to the inner shells of MWCNTs assists the transport of the charge carriers from inner shells to the electrode so as to improve the photocurrent collection efficiency. Furthermore, elimination of the Ohmic contact will considerably reduce the thermal link of the MWCNT detector element to the environment, resulting in considerably elevated temperature in the element and enhanced photocurrent generation as the thermal energy exceeds the exciton binding energy, which can be as small as few to few tens of meV in the MWCNT with large diameters.

MWCNTs with diameters in the range of 40-60 nm were dispersed and deposited on silicon substrates with a 100 nm thermal oxide layer. Two Au (60 nm)/Ti (20 nm) electrodes were fabricated onto the selected individual MWCNT using electron beam lithography (EBL) followed by electron beam evaporation and lift off. The position of electrodes was carefully controlled during the EBL to make sure one end of the MWCNT was covered by the metal electrode and the other, on the MWCNT stem. Two kinds of control samples with symmetric Ohmic (Pd) electrodes and symmetric Au/Ti electrodes both covering the sidewall of individual MWCNTs have been fabricated. In addition, MWCNT films of thickness of about 200 nm fabricated from the same batch of the MWCNTs were prepared for comparison and the fabrication details have been reported elsewhere. The samples were annealed in high vacuum at 400° C. before measurements to improve the electrical contact.

Figure 13C:
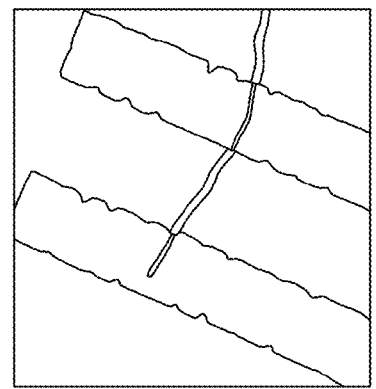
FIG. 13C depicts an SEM image of a practical individual MWCNT with asymmetric electrodes, in accordance with an embodiment of the invention.
Figure 13B:
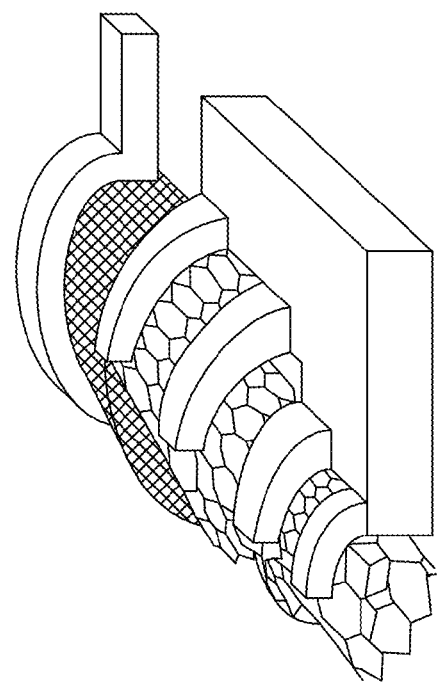
FIG. 13B depicts the internal structure of a semi-transparent electrode, in accordance with an embodiment of the invention.
Figure 14B:
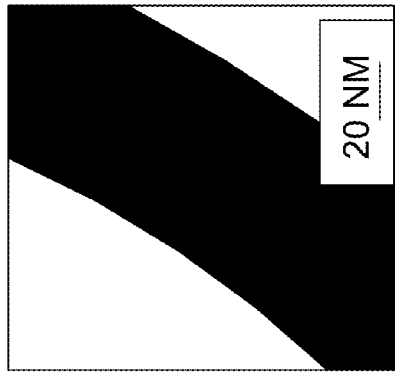
FIG. 14B depicts an enlarged portion of the MWCNT of FIG. 14A that is approximately 20 nm, in accordance with an embodiment of the invention.
Figure 14C:
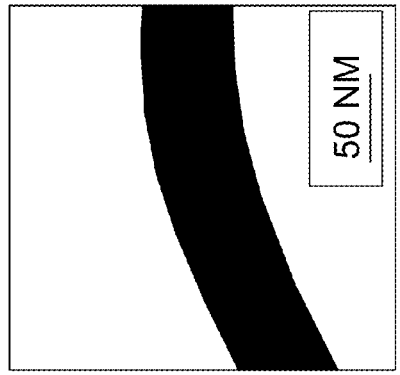
FIG. 14C depicts an enlarged portion of the MWCNT of FIG. 14A that is approximately 50 nm, in accordance with an embodiment of the invention.
Figure 14A:
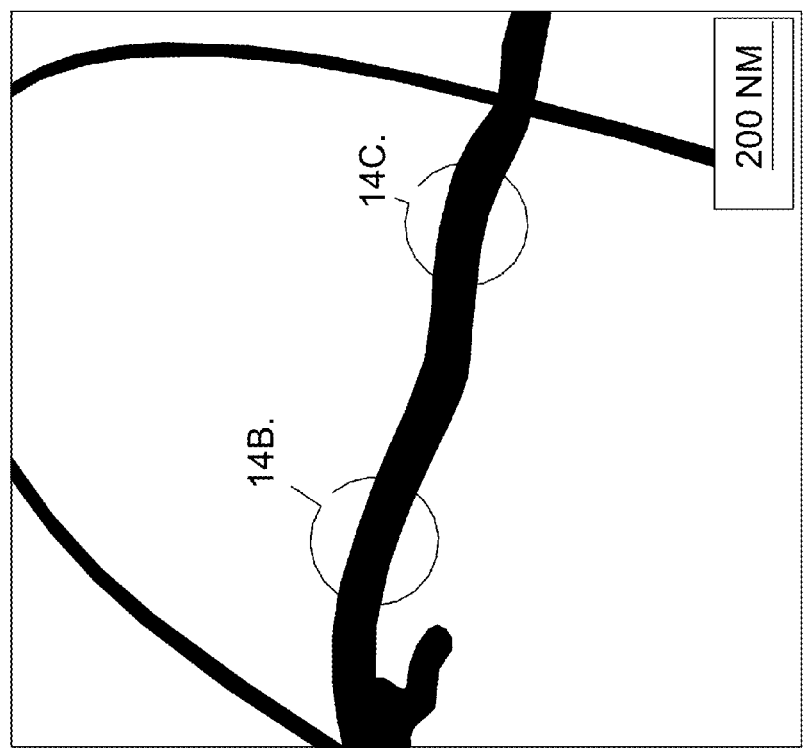
FIG. 14A depicts an exemplary TEM image of a MWCNT with a diameter of approximately 50-60 nm, in accordance with an embodiment of the invention.
Figure 14D:
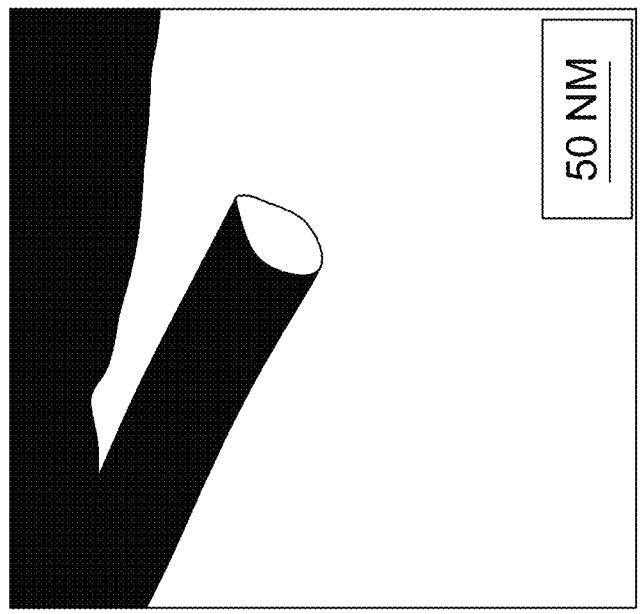
FIG. 14D depicts a TEM image of an exemplary MWCNT showing an open end of approximately 50 nm, in accordance with an embodiment of the invention.

The scanning electron microscopy (SEM) image of a representative MWCNT photodetector is shown in FIG. 13C. The spacing between the electrodes is around 1.3 μm and the diameter of this particular MWCNT is approximately 60 nm. The active detection area is therefore defined as 1.3 μm×60 nm. Notice that the left end of the MWCNT is covered by the electrode, which assures the metal electrode provide electrical contact through the entire CNT's cross-section. FIG. 14A shows the transmission electron microscopy (TEM) images of a similar MWCNT. The inner shells can be clearly identified in the high resolution TEM image and the shell number is estimated to be about 60-70. The diameter of the MWCNT is typically in the range of 50-60 nm. In addition, some segments of the MWCNT have a bamboo-structure center of diameter in the range of 10-15 nm [FIG. 14B] while in other parts, the hollow center becomes negligible [FIG. 14C]. FIG. 14D is another TEM image, where the end opening of a MWCNT can be clearly identified and indicates direct contact from inner shell's terminal to electrode is possible.

Figure 15B:
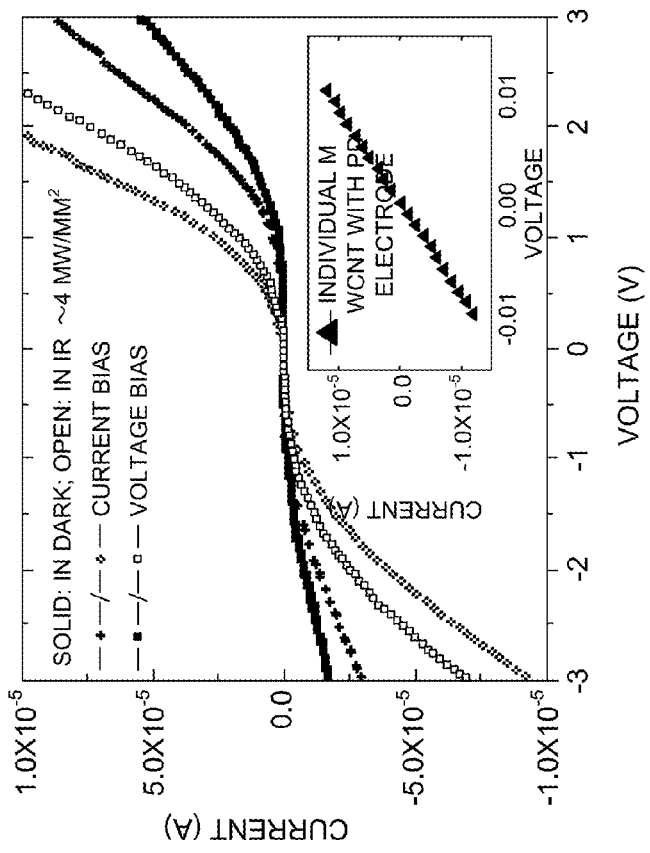
FIG. 15B depicts a comparison of current biased I-V and voltage biased V-I curves of an individual MWCNT, with an inset depicting the V-I curve of individual MWCNT with symmetric Pd contacts.
Figure 15A:
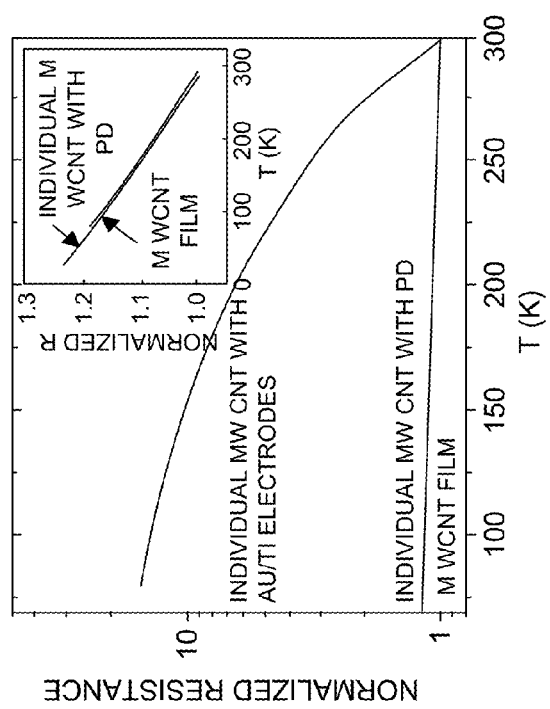
FIG. 15A depicts the normalized R-T curves of an exemplary individual MWCNT with asymmetric Au/Ti electrodes biased at 5 nA, symmetric Pd electrodes at 0.1 μA and MWCNT film biased at 1 μA, separately, with the R-T curves of the later two samples amplified in the inset, in accordance with an embodiment of the invention.
Figure 15C:
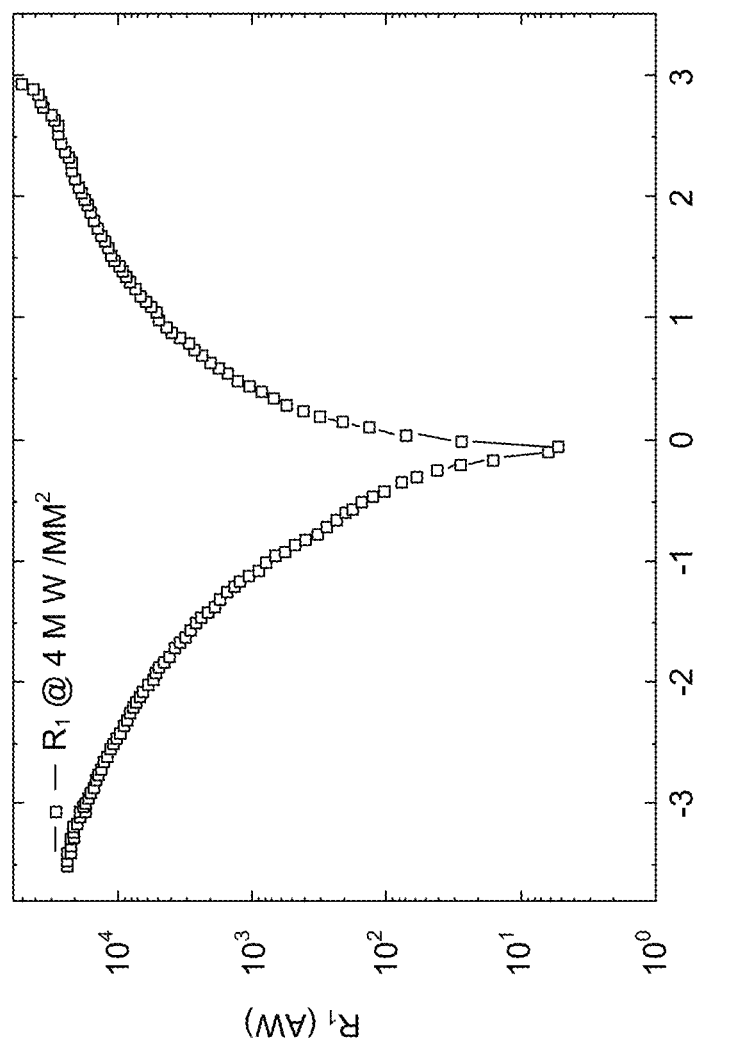
FIG. 15C depicts current responsivity $R_I$ (absolute value) vs. bias voltage in 4 mW/mm$^2$ IR radiation calculated from FIG. 15B, in accordance with an embodiment of the invention.

FIG. 15A compares the normalized resistance (R) vs. temperature (T) curves in semi-log scale for individual MWCNT with asymmetric Au/Ti electrode (blue), individual MWCNT with symmetric Pd electrodes (black) and MWCNT film (red). The individual MWCNT with asymmetric Au/Ti electrodes shows much stronger temperature dependence as compared to the latter two kinds of samples. In fact, the R-T curves of the MWCNT film and individual MWCNT with Pd electrodes almost coincide over the temperature range of 77 K-290 K as shown in a closer view in the inset of FIG. 15A at linear scale. This is not surprising since larger diameter MWCNTs typically have smaller band gaps, making them behave less susceptive to temperature than a larger band-gap semiconductor. Consequently, the connection at the intertube junctions seems to be Ohmic, instead of Schottky, resulting in similar R-T curves on these two kinds of samples. The much steeper R-T curve for the individual MWCNTs with asymmetric Schottky electrodes may be attributed to the dynamic contribution from the Schottky contacts. The TCR value calculated from the dynamic resistance change is in the range of −1.6%/K to −3.9%/K among a group of samples measured at the room temperature, which is considerably larger than the TCR of ~−0.1%/K for individual MWCNTs with Pd electrodes and ~−0.08%/K for MWCNT films at the same temperature. FIG. 15B compares the current (I) [or voltage (V)] biased I-V (or V-I) curves, respectively, for the same MWCNT sample shown in FIG. 13C in dark and under IR (1.1-1.3 μm wavelength) light of intensity of 4 mW/mm$^2$. The I-V (and V-I) curves are nonlinear, confirming the detector is a Schottky device. Clear IR responses have been observed in both voltage and current biased cases and there is no qualitative difference between the voltage and current biased I-V curves. To compare with the previously reported photoresponse on individual MWCNTs, the absolute value of current responsivity $R_I$ in the individual MWCNT with asymmetric Schottky contacts was calculated from the voltage biased V-I curves in FIG. 15B and depicted in FIG. 15C. Significantly enhanced $R_I$ has been observed on these devices. For example, the $R_I$ of 2-4×10$^4$ A/W at +/−3V bias is more than three orders of magnitude larger than that of 23 A/W obtained on individual MWCNT with the conventional Schottky contacts. Negligible $R_I$ was observed on the control samples with symmetric Au/Ti electrodes both covering the sidewall under the same experimental conditions. This is anticipated since both contacts were in the IR beam spot and the photocurrent generated by IR absorption would cancel out in the symmetric contact geometry. In addition, negligible photoresponse was observed on the MWCNT samples with two symmetric Pd Ohmic contacts under the same IR light, as shown in the inset of FIG. 15B. The linear V-I curves indicates good Ohmic electrical contacts provided by the Pd electrodes. The undetectable photoresponse in this kind of MWCNT bolometers (the dark and illuminated curves overlap on each other) is most probably due to the efficient thermal link from the detector to the environment through the Ohmic metal contacts. While more systematic studies are necessary to pinpoint the mechanism responsible for the much enhanced $R_I$ obtained on the individual MWCNT with asymmetric Schottky contacts, we postulate that several unique features combined together in this kind of devices may contribute directly to the improved performance. First, the asymmetric Schottky contacts with one connecting to all inner CNT shells may provide favorable pathways for collecting photocurrent from the inner shells. Considering all inner CNT shell absorb light with a similar efficiency, the photocurrent could increase with increasing the number of inner CNT shells up to an optimal MWCNT diameter (or number of inner shells) for a complete light absorption, which is on the order of 50-100 nm. On the other hand, the Schottky contacts have much reduced thermal link as compared to the Ohmic ones typically used for the Schottky devices. This may result in considerably enhanced detector element temperature exceeding the exciton binding energy and consequently lead to thermally assisted generation of photocurrent. While accurate measurement of the individual MWCNT temperature remains challenging, some estimation that supports this argument may be extracted from the transport property of individual MWCNT and will be discussed in the following.

Figure 16B:
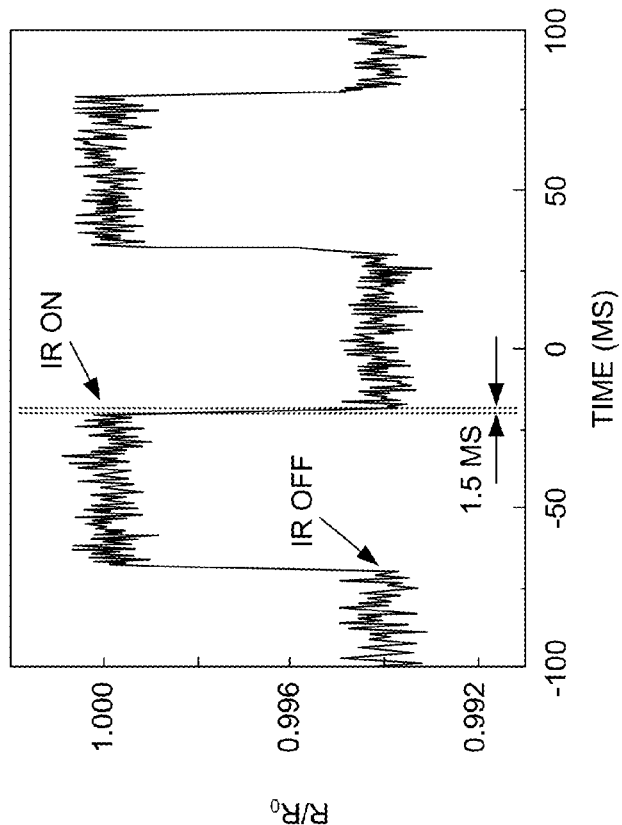
FIG. 16B depicts an exemplary IR photoresponse of MWCNT film, I=2 mA, f=10 Hz, in IR of approximately 3 mW/mm$^2$, with a response time of approximately 1.5 ms, with response time measured from 90% to 10% magnitude change, in accordance with an embodiment of the invention.
Figure 16A:
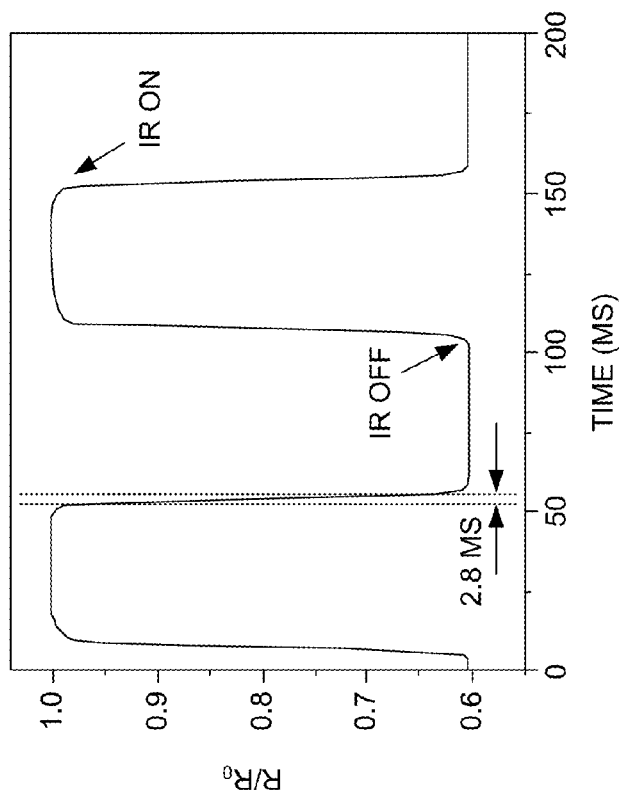
FIG. 16A depicts a temporal IR photoresponse of an individual MWCNT under approximately 3.5 mW/mm$^2$ IR radiation, f=10 Hz and bias current of 10 μA, with a response time of approximately 2.8 ms, in accordance with an embodiment of the invention.

FIG. 16A depicts the temporal dynamic resistance variation of an individual MWCNT with asymmetric Schottky contacts under modulated IR radiation at room temperature. The MWCNT was biased at 10 μA current at the IR light power intensity of ~3.5 mW/mm$^2$ and modulation frequency of 10 Hz. The measured dynamic resistance change ratio $\Delta R/R_0$ ($R_0$ is the resistance in dark and $\Delta R$ is the resistance change value under IR radiation) is about 40% for this individual MWCNT, which is more than 60 times larger than the $\Delta R/R_0$~0.6% obtained on a MWCNT film bolometer under the comparable IR radiation [FIG. 16B]. Considering the $\Delta R/R_0$ in the latter case is a thermal effect, the maximum temperature rise of a MWCNT can be estimated to be about 8 K using the TCR ~−0.08%/K at room temperature for the MWCNT film. Similarly, the maximum temperature rise in individual MWCNT with asymmetric contacts around 10 K can be estimated using the observed resistance change and the TCR ~−3.9%/K at room temperature. Since the exciton binding energy in the MWCNT of large diameter could be as small as few meV, which corresponds to less than 100 K, the 10 K temperature rise may provide considerable thermal energy to assist exciton separations. The response time is about 2.8 ms for this individual MWCNT if measuring from 90% to 10% magnitude change, which is slightly larger than that of MWCNT films around 1.5 ms and may be induced by the reduced thermal link in the former. The response times in both individual and film MWCNT samples are more than one order of magnitude smaller than that of suspended SWCNT films, where film suspension is necessary to reduce the thermal link to the environment in order to achieve unnegligible $R_r$.

Figure 17B:
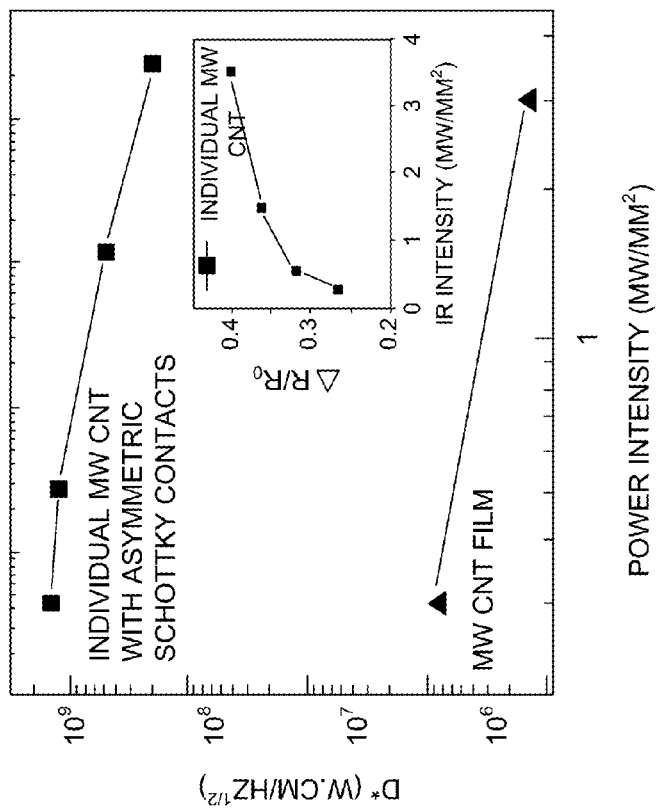
FIG. 17B depicts D* vs. IR power intensity of individual and film MWCNTs, with an inset showing the response $\Delta R/R_0$ vs. power intensity in individual MWCNT, in accordance with an embodiment of the invention.
Figure 17A:
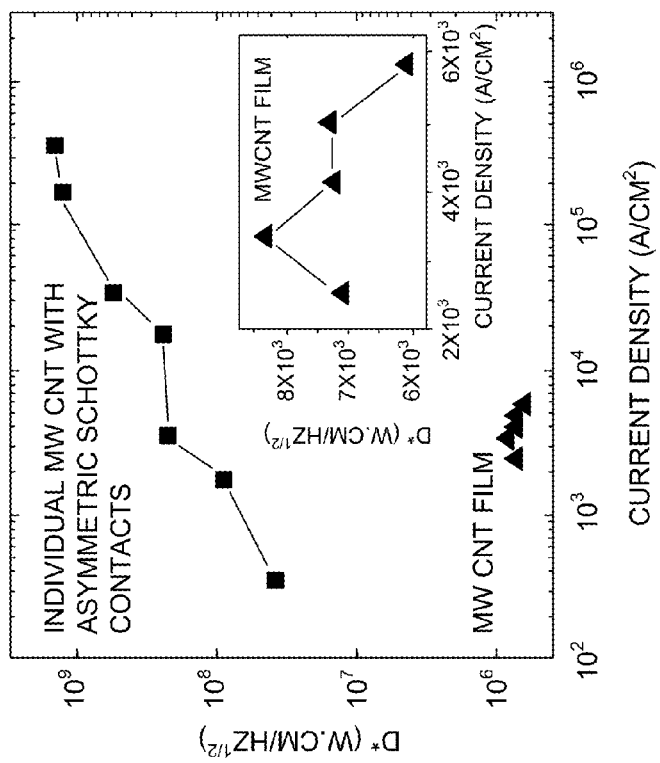
FIG. 17A depicts D* vs. bias current density comparisons for individual MWCNT with asymmetric Schottky contacts and MWCNT film (with an inset blown up), f=10 Hz, IR intensity approximately 0.3 mW/mm$^2$, in accordance with an embodiment of the invention.

The D* values were calculated using the Detectivity Equation and the results are plotted as function of the bias current density in FIG. 17A for individual MWCNTs with asymmetric Schottky contacts and MWCNT films. Since the MWCNT film is not dense, the current density estimated using the nominal film thickness ~200 nm may have large uncertainty. The IR light was fixed at 0.3 mW/mm$^2$ power intensity and 10 Hz modulation frequency for both samples. A much narrower current density range was applied to the film since the saturation of D* has been observed in this range already. The saturation of D* in MWCNT films [inset blow-up of FIG. 17A] may be attributed to the self-heating and TCR decrease at higher bias currents for a bolometer. In addition, deviation of noise voltage from ideal 1/f property was not rare and enhanced noise was observed in the MWCNT film case at higher current density possibly due to the overheating at the intertube junctions. This kind of D* vs. current density variation trend has been reported in conventional VO$_x$ film bolometer in which the TCR value might be decreased at higher bias current due to the power dissipation of DC electrical bias. In contrast, no saturation was observed from the D* vs. current density curve in FIG. 17A for the individual MWCNT sample in a much wider range of the current density. A monotonic increase of D* with the current density is clearly seen with significantly higher D* values as compared to that of the MWCNT film case. The maximum D* is about $1.4 \times 10^9$ W·cm/Hz$^{1/2}$ at $4 \times 10^5$ A/cm$^2$, the maximum current density applied in this experiment (higher current density was avoided to protect the sample), which is considerably higher than that of most conventional VOx uncooled bolometers. Moreover, FIG. 17A also reveals that the individual MWCNT can work in a very wide current density up to at least $10^5$ A/cm$^2$, which is about two orders of magnitude higher than the upper limit ~3000 A/cm$^2$ for MWCNT film before D* saturates.

FIG. 17B shows a comparison of D* values for these two kinds of samples as function of incident IR power intensity. The MWCNT film samples were biased at the current densities corresponding to their maximum D* obtained in FIG. 17A while the individual MWCNT samples were biased at the maximum current density used in FIG. 17A. A similar trend of monotonic decreasing D* with IR light power density can be observed on both samples. This trend is induced by the nonlinear variation of $\Delta R/R_0$ with IR light power intensity, as shown in the inset of FIG. 17B for the individual MWCNTs with asymmetric Schottky contacts, which results in decreasing responsivity with increasing IR power intensity. Consequently, D* decreases since the noise voltage remains almost constant with increasing IR power intensity. This variation trend is qualitatively consistent with the reported trend for SWCNT bundle microwave bolometers where $R_v$ decreases to by two orders of magnitude while the incident microwave power intensity increases by four orders of magnitude. Noticing that the nonlinear increase of $\Delta R/R_0$ vs. power intensity is not expected for pure photonic response as the photo-carrier generation is linearly proportional to the number of the incident photons, which has been reported by Xi et al in individual CNTs with natural Schottky symmetry under near-IR illumination of 1.9-3.9 W/mm$^2$. This further indicates an evidence that the response observed in the individual MWCNT with asymmetric Schottky contact geometry may not be a conventional photonic, but most probably combined with thermally assisted exciton separation.

Figure 17C:
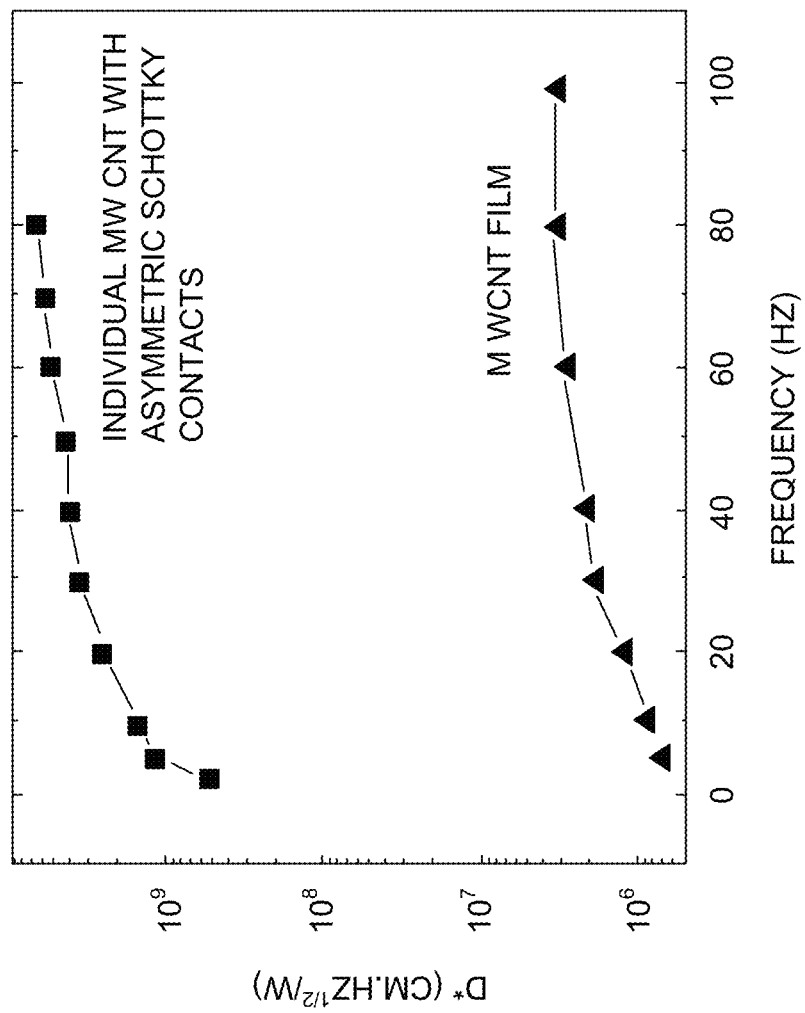
FIG. 17C depicts D* as a function of modulation frequency at a constant IR power intensity of 0.3 mW/mm$^2$, I=10 μA for individual MWCNT and 2 mA for MWCNT film, in accordance with an embodiment of the invention.

The dependence of D* on modulation frequency for both individual and film MWCNT samples are compared in FIG. 17C. The D* increases monotonically with increasing frequency for both kinds of samples. This increase is attributed to the decrease of the 1/f type noise voltage with increasing frequency. Moreover, at a fixed bias current, the 1/f type noise voltage will saturate to the thermal noise when the frequency is high enough, thus the D* saturates accordingly since the decrease of $R_v$ with frequency is very small. For individual MWCNT, D* almost saturates at 80 Hz with a maximum $\sim 6.2 \times 10^9$ cm·Hz$^{1/2}$/W, which is about 2000 times higher than the best saturated D* in MWCNT film. In addition, this D* value is about one order of magnitude higher than that of commercial VO$_x$ uncooled IR detectors ~$10^8$ cm·Hz$^{1/2}$/W and even five times of the state-of-arts doped VO$_x$ thin film bolometer at D*~$1.2 \times 10^9$ cm·Hz$^{1/2}$/W. This result demonstrates that individual MWCNT photodetector is a promising candidate for practical applications of uncooled IR detectors.

In conclusion, significantly improved detectivity D* up to $6.2 \times 10^9$ cm·Hz$^{1/2}$/W has been obtained on individual MWCNT IR photodetectors at room temperature. The photoresponse has been enhanced to $10^4$ A/W, which is three orders of magnitude larger than that previously obtained on conventional CNT Schottky devices. The enhanced sensitivity is attributed primarily to the efficiently improved photocurrent harvesting due to the asymmetric Schottky contacts with one covering the sidewall and the other on the end of CNT, providing unbalanced build-in electric field and efficient photocurrent collection to all inner CNT shells while maintaining reduced thermal link to the environment. In addition, thermally assisted exciton dissociation to free carriers may provide a further contribution to the photocurrent and this contribution decreases at higher incident light power intensity. The significantly improved sensitivity makes individual MWCNT photodetector promising for practical uncooled IR detections.

Manipulating Infrared Response and Transport Properties in Multiwall Carbon Nanotube Thin Film Bolometers Using Graphene Flakes Multi-wall carbon nanotubes (MWCNT) are promising candidates for infrared bolometers but currently demonstrate detectivities (D*) on the order of ~$3 \times 10^6$ cm*Hz$^{1/2}$/w which is nearly two orders of magnitude lower than the range reported for traditional vanadium oxide detectors. Improving the contact in MWCNT intertube junctions may provide an opportunity for improvement in MWCNT bolometric films. In this paper we have coupled intertube junctions with graphene flakes in order to increase the efficiency of electrical transport across the junction and a D* of over $1.5 \times 10^7$ cm*Hz$^{1/2}$/W has been measured. A comparative study of the photoresponse in MWCNT bolometer films with and without graphene is presented.

Carbon nanotubes (CNT) offer a promising alternative to traditional vanadium oxide (VOx) sensors for thermal imaging due to their moderate band gap and absorbance efficiency in the infrared (IR) range. Though VOx films constitute the standard for uncooled microbolometer arrays, their high material cost and toxicity provide a reasonable motivation for a safer, more economical replacement. While advances in CNT-based microbolometer sensors have demonstrated D* of up to $3.3 \times 10^6$ cm*Hz$^{1/2}$/W it is still nearly two orders of magnitude lower than the reported D* of $1.94 \times 10^8$ cm*Hz$^{1/2}$/W for VOx sensors.

Thermal annealing of CNT bolometric sensors improves the noise property and the temperature coefficient of resistance, both of which play a critical role in the sensor's D*, due to the enhanced coupling across the intertube junctions in the CNT network. Further improvement to the charge transport across the intertube junctions may hold the key to improving the D* and make MWCNT sensors a viable replacement for VOx microbolometers. The conductivity of graphene flakes makes them a viable candidate for increasing the electrical transport across the intertube junctions while their thin (~5-8 nm) profile prohibits them from unnecessarily disrupting the morphology of the film. Integration of a few graphene nanoplatelets will provide a conducting path across a portion of the MWCNT junctions, allowing for improved electrical transport across the film while allowing the bulk of the film to remain semiconducting to remain semiconducting in order to maintain the bolometric response in the film.

A suspension of 40-60 nm diameter MWCNT (Shenzhen Bill Technology Development Ltd., China) was sonicated with a suspension of 5-8 nm thick graphene nanoplatelets (XGnP-M-5, XG Sciences) at a ratio of 3:1. The resulting suspension was processed via vacuum filtration resulting in a MWCNT and graphene flake (MWCNT/G) film. The film was then transferred to a SiO$_2$/Si substrate with four Au (40 nm)/Ti (5 nm) electrodes and annealed at 400° C. for 90 min at pressure below $5 \times 10^{-6}$ Torr. IR radiation was provided by a near-infrared light of 1000-1300 nm wavelength [reference]. IR power intensity was calibrated using a Thorlabs PM100D thermal powermeter. Noise property was measured using a SR760 spectrum analyzer. All measurements were performed in air at room temperature, consistent with procedures reported for the MWCNT film.

Figure 18B:
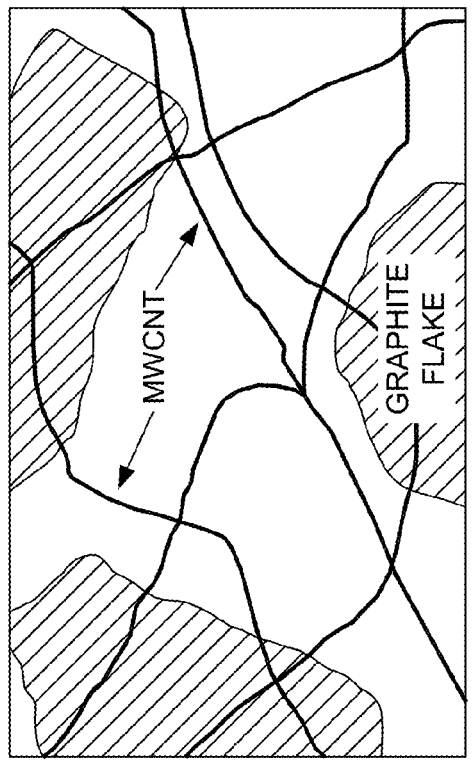
FIG. 18B is a schematic of MWCNT/G network with components labeled, in accordance with an embodiment of the invention.
Figure 18A:
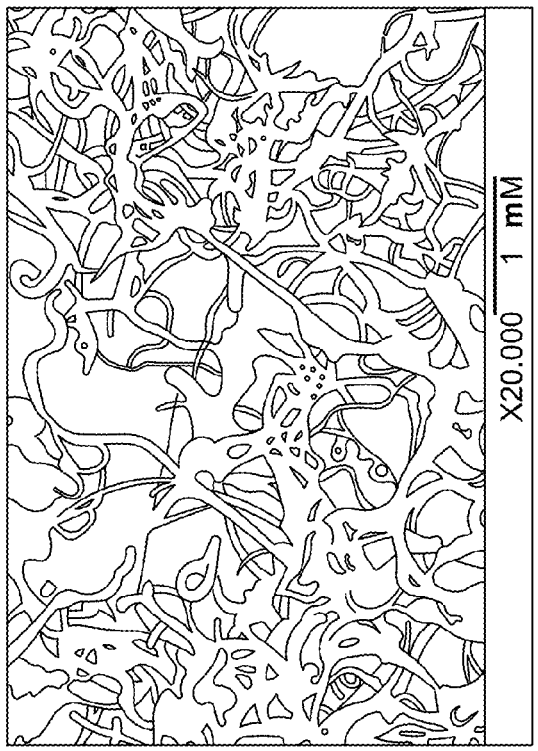
FIG. 18A depicts an SEM image of MWCNT network with graphene flakes, in accordance with an embodiment of the invention.

FIG. 18A is an SEM image of the MWCNT/G network which shows the random distribution of graphene flakes into the MWCNT lattice. The MWCNT/G film itself is non-uniform with an average thickness of ~160 nm. The graphene flakes have an average width of 1-2 microns and tend to overlap multiple intertube junctions.

Figure 19B:
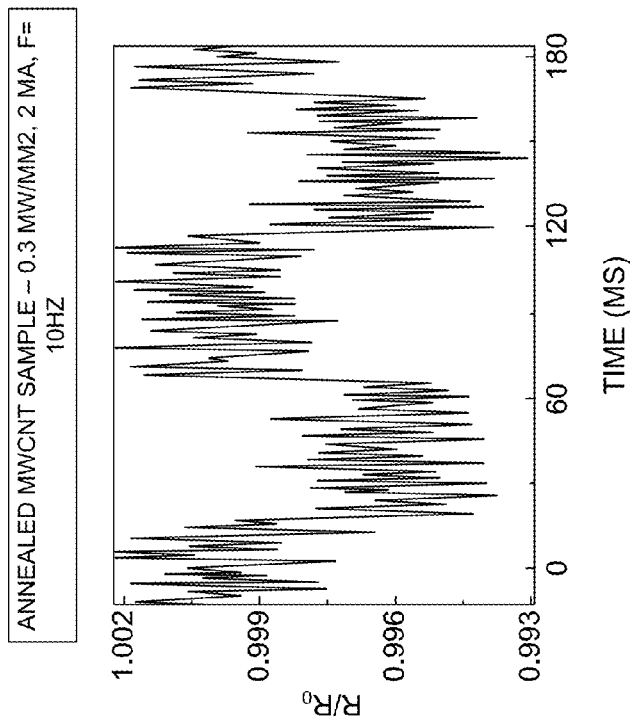
FIG. 19B depicts a temporal response of MWCNT film without graphene flakes, with an IR of approximately 0.3 mW/mm$^2$, f=10 Hz, I=2 mA, in accordance with an embodiment of the invention.
Figure 19A:
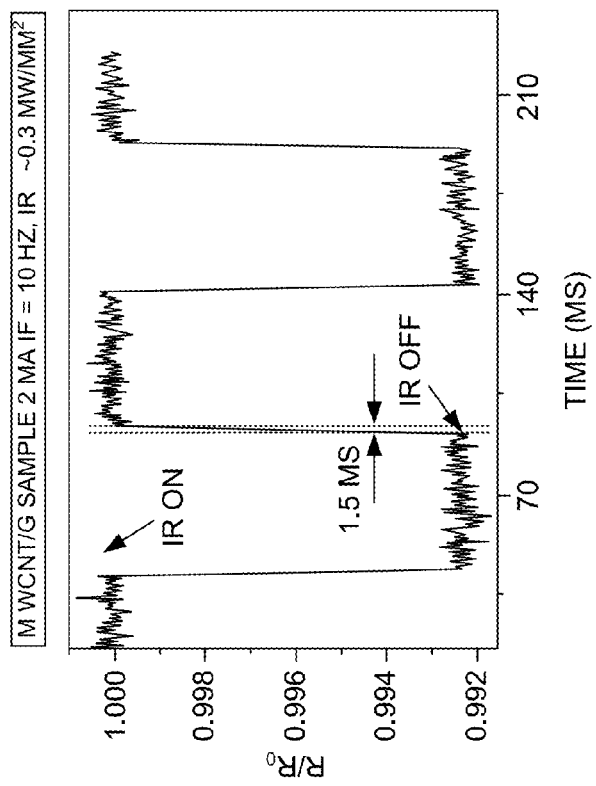
FIG. 19A depicts a temporal response of MWCNT film with graphene flakes, with an IR of approximately 0.3 mW/mm$^2$, f=10 Hz, I=2 mA, in accordance with an embodiment of the invention.

FIG. 19A shows the temporal response of the MWCNT/G film to IR radiation, which produces a reproducible, consistent square wave. The response time of the sample is between one to two milliseconds which is comparable to that of the pure MWCNT sample.

Figures 20A, 20B:
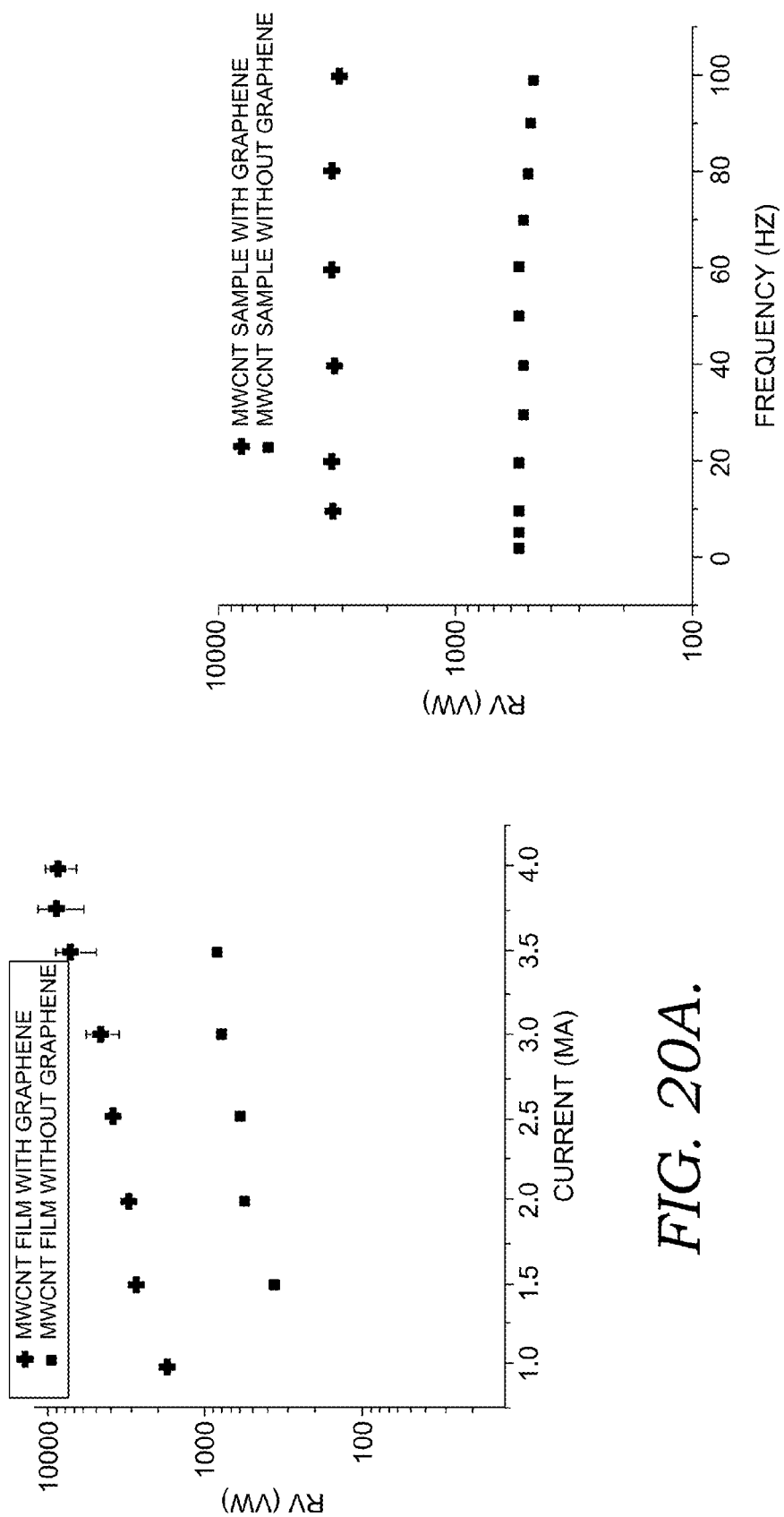
FIG. 20A depicts a comparison of responsivity as a function of current for MWCNT films with and without graphene flakes, in accordance with an embodiment of the invention.
FIG. 20B depicts a comparison of responsivity as a function of frequency for MWCNT films with and without graphene flakes, in accordance with an embodiment of the invention.

FIGS. 20A-20B demonstrate that the sample with graphene follows the same trend for Responsivity ($R_v$) versus current and versus frequency as the pure MWCNT sample but with nearly an order of magnitude improvement. $R_v = i \times \Delta R / \Delta P$ and $\Delta R = \Delta T \times R \times TCR$ where i is current, $\Delta R$ is the change in resistance, $\Delta T$ is the change in temperature, and TCR is the temperature coefficient of resistance $$(TCR = \frac{dR}{RdT},$$

R is the sample resistance and T is temperature). The calculated TCR of the MWCNT/G sample is ~0.08%/K at room temperature which is comparable to the reported 0.07%/K TCR of the MWCNT sample. The $R_v$ for a fixed current is a function of TCR and $\Delta T$, and since there is only a small improvement in TCR then the order of magnitude increase in $R_v$ is expected to have come from the change in temperature of the sample.

FIG. 21A shows a comparison of linear noise spectra between MWCNT and MWCNT/G films in a log-log plot while FIG. 21B shows the expected linear increase in $V_n$ for MWCNT/G as a function of current. The noise amplitude coefficient (A) of the MWCNT/G sample is $4 \times 10^{-11}$ which is comparable to the $3.6 \times 10^{-11}$ reported for similar MWCNT films while $\beta \sim 1.08$ which indicates that the sample noise is predominantly 1/f noise.

Finally, FIGS. 20A-20B compare the D* as a function of current and frequency for MWCNT films with and without graphene. While D* vs Frequency follows the same trend for both films, D* vs Current shows both samples following the same trend at lower currents and then the MWCNT/G D* increases rapidly for I>3.5 mA. Since D* is a function of Vn and Rv, and since Vn increases linearly for all currents then the sudden increase in D* is an amplification of the more gradual increase in Rv at I>3.5 mA as seen in FIG. 20A. The cause for this heightened response is not clearly understood but may be an effect of sample heating at high currents.

We have integrated graphene flakes into MWCNT bolometer films in order to improve the inter-tube junctions. The introduction of graphene flakes has provided an increased photoresponse without sacrifice of the fast response time and low noise levels characteristic of MWCNT films. The MWCNT/G sensor has a D* of nearly an order of magnitude higher than the pure MWCNT sample which indicates that further modification of the intertube junctions may close the gap between the sensitivity of CNT and VOx microbolometers allowing CNT films to become a viable contender for thermal imaging.

As can be understood, embodiments of the present invention provide for the use of MWCNT opto-electronic devices for high-sensitivity detection. The present invention has been described in relation to particular embodiments, which are intended in all respects to be illustrative rather than restrictive. Alternative embodiments will become apparent to those of ordinary skill in the art to which the present invention pertains without departing from its scope. Additionally, although this application discusses specific examples of various embodiments of multiwall carbon nanotube opto-electronic detectors, these are merely examples of embodiments and are not meant to be limiting.

From the foregoing, it will be seen that this invention is one well adapted to attain all the ends and objects set forth above, together with other advantages which are obvious and inherent to the system and method. It will be understood that certain features and subcombinations are of utility and may be employed without reference to other features and subcombinations. This is contemplated by and is within the scope of the claims.

What is claimed is:

1. An opto-electronic detector for high-sensitivity photo detection, the detector comprising:
    a pair of electrodes;
    at least one multiwall carbon nanotube electrically connecting the pair of electrodes, wherein each of the pair of electrodes are in contact with the at least one multiwall carbon nanotube, and wherein each electrode of the pair of electrodes comprises a Schottky contact on the multiwall carbon nanotube;
    a current source providing a current to the pair of electrodes; and
    a voltmeter to detect voltage changes caused by incident photons induced heating of the at least one multiwall carbon nanotube.

2. The detector of claim 1, wherein the at least one multiwall carbon nanotube comprises an individual multiwall carbon nanotube.

3. The detector of claim 1, wherein the at least one multiwall carbon nanotube comprises a plurality of multiwall carbon nanotubes arranged in a film.

4. The detector of claim 3, wherein the plurality of multiwall carbon nanotubes arranged in a film are unsuspended.

5. The detector of claim 3, wherein the plurality of multiwall carbon nanotubes arranged in a film are suspended.

6. The detector of claim 3, wherein the plurality of multiwall carbon nanotubes arranged in a film comprises one or more graphene flakes.

7. The detector of claim 6, wherein the plurality of multiwall carbon nanotubes arranged in a film are unsuspended.

8. The detector of claim 6, wherein the plurality of multiwall carbon nanotubes arranged in a film are suspended.

9. An opto-electronic detector for high-sensitivity photo detection, the detector comprising
    an array of electrode pairs;
    at least one multiwall carbon nanotube electrically connecting the array of electrode pairs, wherein for each electrode pair, a first electrode of the electrode pair directly contacts one or more inner shells of the at least one multiwall carbon nanotube, and a second electrode of the electrode pair contacts only an outermost shell of the at least one multiwall carbon nanotube;
    a voltage source providing a current to the array of electrode pairs; and
    an ampmeter to detect changes in current driven by a voltage differential caused by photons absorbed by the at least one multiwall carbon nanotube.

10. The detector of claim 9, wherein the at least one multiwall carbon nanotube comprises a plurality of multiwall carbon nanotubes arranged in a film.

11. The detector of claim 10, wherein the plurality of multiwall carbon nanotubes arranged in a film are unsuspended.

12. The detector of claim 10, wherein the plurality of multiwall carbon nanotubes arranged in a film are suspended.

13. A multiwall carbon nanotube opto-electronic detector, the detector comprising:
a pair of electrodes; and
at least one multiwall carbon nanotube electrically connecting the pair of electrodes, wherein each of the pair of electrodes are in contact with the at least one multiwall carbon nanotube, wherein each electrode of the pair of electrodes comprises a Schottky contact on the multiwall carbon nanotube.

14. The detector of claim 13, wherein the at least one multiwall carbon nanotube comprises an individual multiwall carbon nanotube.

15. The detector of claim 14, wherein the individual multiwall carbon nanotube comprises an asymmetric contact design.

16. The detector of claim 13, wherein the two electrodes generate a Schottky contact with at least one conducting material.

17. The detector of claim 16, wherein the at least one conducting material comprises a metal.

18. The detector of claim 13, wherein the at least one multiwall carbon nanotube comprises at least one Schottky contact on the stem of the at least one multiwall carbon nanotube.

19. The detector of claim 13, wherein at least one Schottky contact covers at least one end of the at least one multiwall carbon nanotube.

* * * * *